US011368162B2

(12) United States Patent
Minotani et al.

(10) Patent No.: US 11,368,162 B2
(45) Date of Patent: Jun. 21, 2022

(54) SELF-CALIBRATION FUNCTION-EQUIPPED AD CONVERTER

(71) Applicant: Nippon Telegraph and Telephone Corporation, Tokyo (JP)

(72) Inventors: Tadashi Minotani, Musashino (JP); Kenichi Matsunaga, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/292,685

(22) PCT Filed: Oct. 29, 2019

(86) PCT No.: PCT/JP2019/042351
§ 371 (c)(1),
(2) Date: May 10, 2021

(87) PCT Pub. No.: WO2020/100575
PCT Pub. Date: May 22, 2020

(65) Prior Publication Data
US 2022/0014207 A1 Jan. 13, 2022

(30) Foreign Application Priority Data
Nov. 12, 2018 (JP) .............................. JP2018-212411

(51) Int. Cl.
*H03M 1/10* (2006.01)
(52) U.S. Cl.
CPC ................................ *H03M 1/1009* (2013.01)
(58) Field of Classification Search
CPC ........ H03M 1/1009; H03M 1/10; H03M 1/56; G01R 19/00; G01R 19/257; G01R 35/00
(Continued)

(56) References Cited

U.S. PATENT DOCUMENTS 7,528,757 B2 * 5/2009 Landolt ............... H03M 1/1057
341/118
7,589,650 B2 * 9/2009 Hsien ................. H03M 1/1061
341/118
(Continued)

OTHER PUBLICATIONS

*Outline and Mechanism of A / D Conversion*—Support page of MEMEs, literature, Sep. 10, 2018, http://memes.sakura.ne.jp/memes/?page_id=1120.
(Continued)

*Primary Examiner* — Jean B Jeanglaude
(74) *Attorney, Agent, or Firm* — Workman Nydegger

(57) ABSTRACT

An AD converter is provided with a control unit including a calibration control unit that controls an operation for calibrating the control unit and a conversion control unit that controls an operation for converting a target input voltage into a digital signal; a reference voltage unit that outputs a reference voltage; and an integrating converter unit including an integrating unit that generates an integrated voltage by integrating a predetermined unit voltage, a comparator that has two inputs and compares the integrated voltage and an input voltage or a reference voltage Vref, and a crossbar switch that switches connections between the case where the integrated voltage is inputted to one of the inputs of the comparator and the input voltage or the reference voltage Vref is inputted to the other input and the case where the input voltage or the reference voltage Vref is inputted to one of the inputs of the comparator and the integrated voltage is inputted to the other input.

9 Claims, 7 Drawing Sheets

(58) Field of Classification Search
USPC .................................................. 341/120, 155
See application file for complete search history.

(56) References Cited

U.S. PATENT DOCUMENTS

| | | | | |
|---|---|---|---|---|
| 8,766,833 | B1* | 7/2014 | Bogner | H03M 1/1014 341/120 |
| 9,024,797 | B2* | 5/2015 | Feldotte | H03M 1/002 341/158 |
| 10,072,976 | B2* | 9/2018 | Xu | G01J 1/46 |
| 10,749,436 | B2* | 8/2020 | Ali | H02M 3/1582 |
| 11,057,041 | B1* | 7/2021 | Strijker | H03M 1/0604 |
| 2008/0111726 | A1* | 5/2008 | Landolt | H03M 1/1057 341/159 |
| 2008/0158037 | A1* | 7/2008 | Hsien | H03M 1/1061 341/164 |
| 2015/0002327 | A1* | 1/2015 | Feldotte | H03M 1/089 341/158 |
| 2019/0214914 | A1* | 7/2019 | Ali | H03K 17/122 |

OTHER PUBLICATIONS

EDN Japan, *Trimming to Improve DAC Accuracy* (1/3), literature, Nov. 10, 2016, http://ednjapn.com/edn/articles/1611/08/news012.html.

* cited by examiner

Fig. 2(a) EQUIVALENT CIRCUIT OF INITIALIZATION AND COMPARING STEP
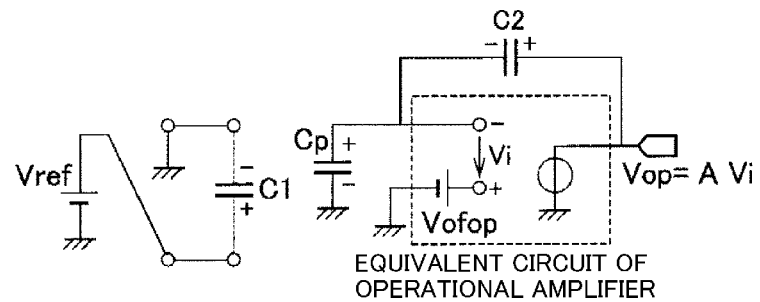
Fig. 2(b) EQUIVALENT CIRCUIT DURING CHARGE STORING
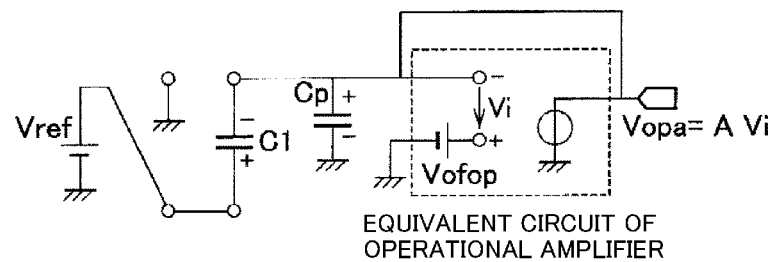
Fig. 2(c) EQUIVALENT CIRCUIT DURING CHARGE TRANSFER
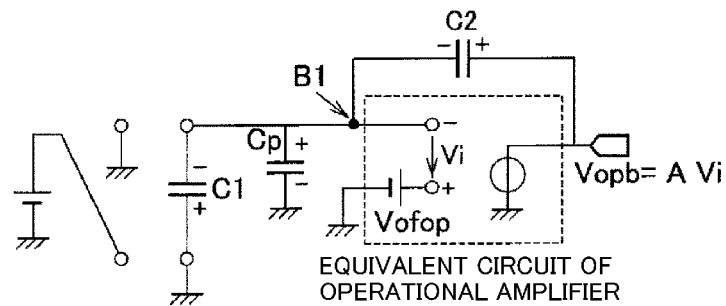

Fig. 6(a) CONNECTION BETWEEN s11 AND s13 AND BETWEEN s12 AND s14 IN CROSSBAR SWITCH
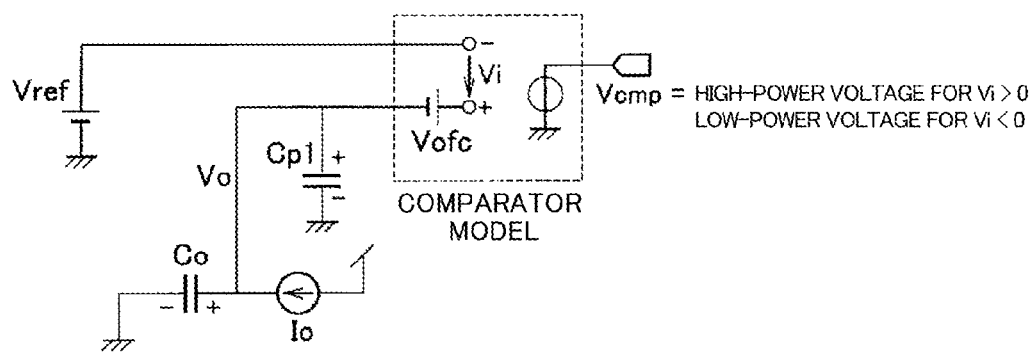
Fig. 6(b) CONNECTION BETWEEN s11 AND s14 AND BETWEEN s12 AND s13 IN CROSSBAR SWITCH
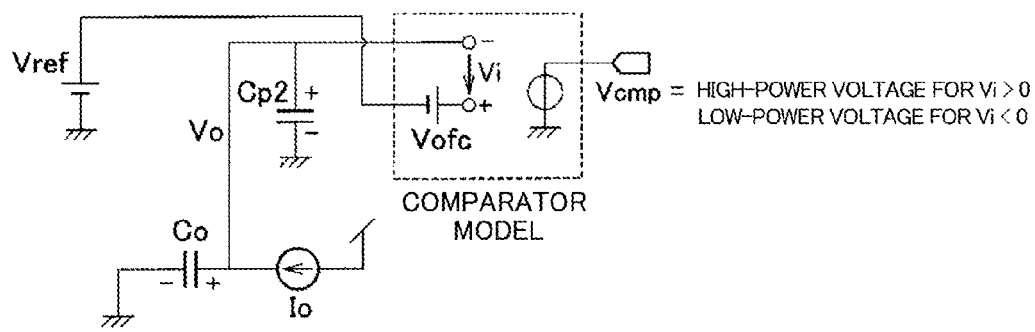

SELF-CALIBRATION FUNCTION-EQUIPPED AD CONVERTER

TECHNICAL FIELD

The present invention relates to an AD converter with a self-calibration function that eliminates the need for a measuring device for calibration.

BACKGROUND ART

An AD converter includes a DA converter that outputs a known voltage and a comparator. Representative DA converters include an R-2R ladder circuit, a resistor string circuit, and a PWM circuit (NPL 1).

The conversion accuracy of an AD converter is mainly determined by the offset voltage of a comparator and the unit voltage and linearity of a DA converter. Since the values have temperature characteristics, the conversion accuracy is affected by a temperature change.

Furthermore, the offset voltage of the comparator and the unit voltage and linearity of the DA converter change with the passage of time. Hence, in order to keep the conversion accuracy over an extended period of time, periodic calibration is essential (NPL 2).

CITATION LIST

Non Patent Literatures

[NPL 1] Outline and mechanism of A/D conversion—MEMEs support page [retrieved on 10 Sep. 2018], Internet (URL: http://memes.sakura.ne.jp/memes/?page_id=1120)

[NPL 2] Trimming for improving accuracy of DAC (1/3) EDN Japan [retrieved on 22 May 2018], Internet (URL: http://ednjapn.com/edn/articles/1611/08/news012.html)

SUMMARY OF THE INVENTION

Technical Problem

However, in order to adjust the offset voltage of the comparator and the unit voltage of the DA converter, a measuring device as a reference is necessary outside the AD converter. For example, for calibration of an AD converter at a remote location, it is necessary to carry a measuring device. This leads to difficulty in calibrating a plurality of AD converters at remote locations.

The present invention has been devised to solve the problem. An object of the present invention is to provide an AD converter with a self-calibration function that eliminates the need for a measuring device for calibration.

Means for Solving the Problem

An AD converter with a self-calibration function according to an aspect of the present invention is an AD converter with a self-calibration function that eliminates need for a measuring device for calibration, the AD converter being provided with a control unit including a calibration control unit that controls an operation for calibrating the control unit and a conversion control unit that controls an operation for converting a target input voltage into a digital signal, a reference voltage unit that outputs a reference voltage, and an integrating converter unit including an integrating unit that generates an integrated voltage by integrating a predetermined unit voltage, a comparator that has two inputs and compares the integrated voltage and an input voltage or the reference voltage, and a crossbar switch that switches connections between the case where the integrated voltage is inputted to one of the inputs of the comparator and the input voltage or the reference voltage is inputted to the other input and the case where the input voltage or the reference voltage is inputted to one of the inputs of the comparator and the integrated voltage is inputted to the other input.

Effects of the Invention

The present invention can provide an AD converter with a self-calibration function that eliminates the need for an external measuring device for calibration.

BRIEF DESCRIPTION OF DRAWINGS

FIGS. 2(a)-2(c) illustrates the equivalent circuit of an integrating unit in FIG. 1.

FIGS. 6(a)-6(b) illustrate the equivalent circuit of a comparator in FIG. 5.

DESCRIPTION OF EMBODIMENTS

Figure 1:
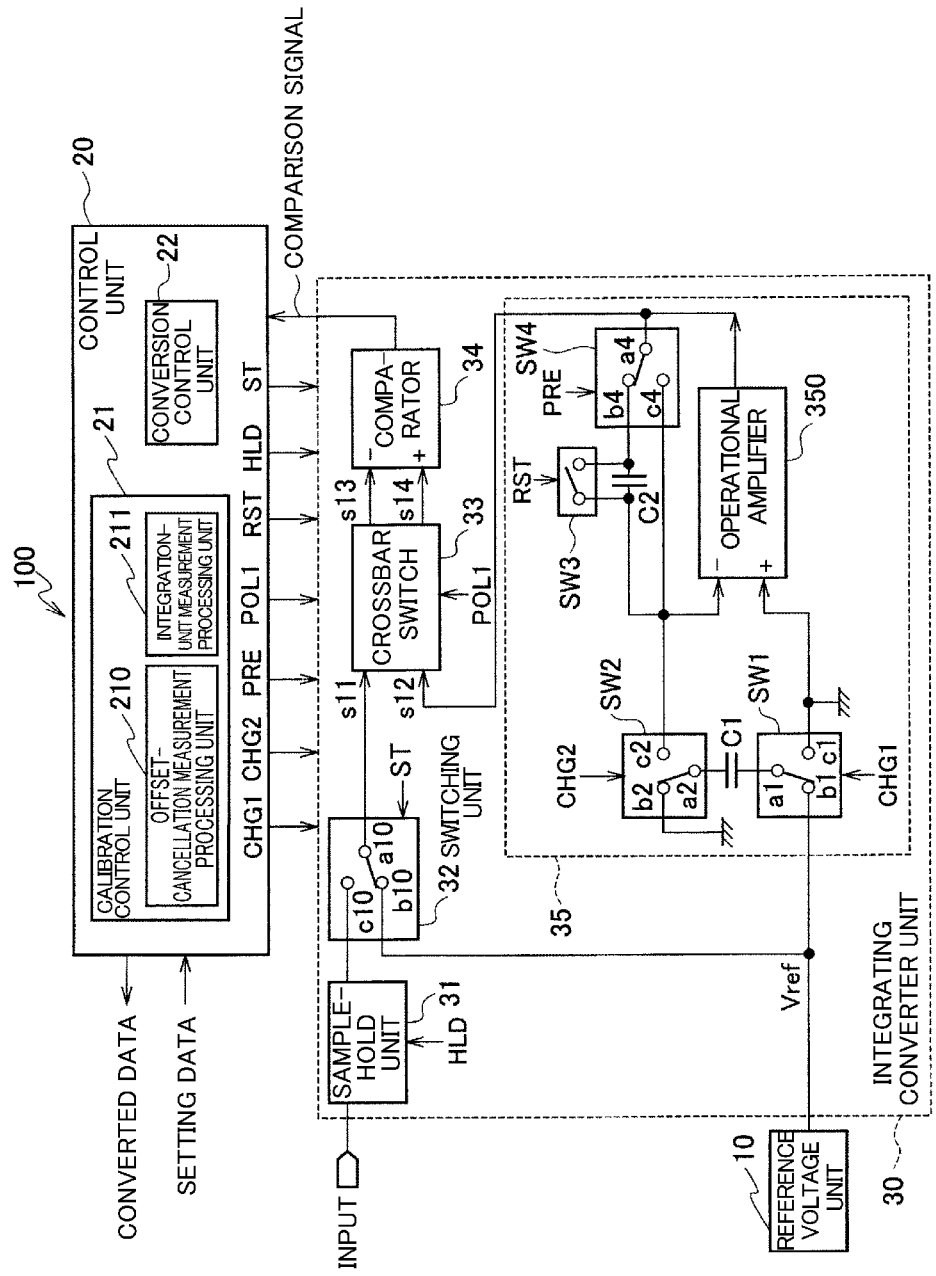
FIG. 1 is a functional block diagram illustrating a configuration example of an AD converter with a self-calibration function according to a first embodiment of the present invention.

Embodiments of the present invention will be described below in accordance with the accompanying drawings. The same constituent elements are indicated by the same reference numerals in the drawings and the explanation thereof is not repeated.

First Embodiment

FIG. 1 is a functional block diagram illustrating a functional configuration example of an AD converter with a self-calibration function according to a first embodiment of the present invention. An AD converter 100 with a self-calibration function in FIG. 1 includes a reference voltage unit 10, a control unit 20, and an integrating converter unit 30. The AD converter 100 converts an input voltage, which is an analog signal, into a digital signal. Moreover, the AD converter 100 has a self-calibration function that eliminates the need for a measuring device for calibrating, outside the AD converter, the offset voltage of a comparator or the like used for conversion and the integration unit voltage of a DA converter that outputs a known voltage.

The reference voltage unit 10 outputs a reference voltage Vref. The control unit 20 includes a calibration control unit 21 that controls an operation for calibrating the control unit 20 (calibrated state) and a conversion control unit 22 that controls an operation for converting a target input signal into a digital signal (converted state).

The integrating converter unit 30 includes a sample-hold unit 31, a switching unit 32, a crossbar switch 33, a comparator 34, and an integrating unit 35. The integrating unit 35 includes a switch 1 (hereinafter, will be referred to as SW1), a switch 2 (hereinafter, will be referred to as SW2), a capacitor C1, an operational amplifier 36, a capacitor C2, a switch 3 (hereinafter, will be referred to as SW3), and a switch 4 (hereinafter, will be referred to as SW4). The connections of the switching unit 32, the crossbar switch 33, and SW1 to SW4 are controlled by the control unit 20.

The integrating converter unit 30 in the conversion state integrates the integration unit voltage until the unit voltage reaches the input voltage. k is the number of integrations of the integration unit voltage until the unit voltage reaches the input voltage. k is converted data obtained by converting the input voltage into the digital signal. k is output to the outside from the control unit 20. An ordinary operation is performed in the converted state.

The integrating converter unit 30 in a calibrated state calibrates the offset voltage of the comparator 34 and the operational amplifier 36 and the integration unit voltage. The integration unit voltage is the voltage of the capacitor C1.

An operation in the calibrated state is controlled by an offset-cancellation measurement processing unit 210 and an integration-unit measurement processing unit 211. The offset-cancellation measurement processing unit 210 will be described below.

(Offset-Cancellation Measurement Processing Unit)

The offset-cancellation measurement processing unit 210 performs three steps: an initialization and comparing step α1, a charge storing step α2, and a charge transfer step α3.

In the initialization and comparing step α1, the charge of the capacitor C2 connected between the negative input and the output of the operational amplifier 36 is first initialized to 0. The initialization is performed by connecting SW3 that is connected in parallel with the capacitor C2. After the initialization, SW3 is kept disconnected. The connection and disconnection of SW3 are controlled by a control signal RST from the control unit only for the first time.

Furthermore, in the initialization and comparing step α1, a1 and b1 of SW1 are connected to each other, which connects one of the terminals of the capacitor C1 to the reference voltage Vref, and a2 and b2 of SW2 are connected to each other, which connects the other terminal of the capacitor C1 to a ground potential (ground). In the initialization and comparing step α1, the capacitor C1 (hereinafter, will be referred to as C1) is charged by the reference voltage Vref. The connections of SW1 and SW2 are controlled by control signals CHG1 and CHG2, respectively, from the control unit 20. Hereinafter, the control signals are indicated in the drawings and the explanation thereof is omitted.

FIG. 2(a) illustrates the equivalent circuit of the integrating unit 35 in this state. As illustrated in FIG. 2, the negative input of the operational amplifier 36 has a parasitic capacitance Cp (hereinafter, will be referred to as Cp). Charges Q2,0 and Qp,0 that are stored in the capacitor C2 (hereinafter, will be referred to as C2) and the parasitic capacitance Cp are expressed by Expressions (1) and (2) where Vop,0 is the output of the operational amplifier 36.

Formula 1

$$Q2,0 = C2(Vop,0 - Vofop + Vi) \quad (1)$$
$$= C2\left(Vop,0 - Vofop + \frac{Vop,0}{A}\right)$$

-continued
$$Qp,0 = Cp(-Vi + Vofop) \quad (2)$$
$$= Cp\left(-\frac{Vop,0}{A} + Vofop\right)$$

Vop,0 is the output voltage of the operational amplifier 350 and an initial value before an integrating operation is performed. A number at the end of the reference character indicates the number of integrations. Hereinafter, the number of integrations is denoted as an integer or k.

Vofop indicates an offset voltage between the positive and negative inputs of the operational amplifier 350. Vi is a potential difference between the positive and negative inputs in the operational amplifier 350 and is relevant to the output voltage Vop,0 as expressed in Vop,0=AVi (A is the gain of the operational amplifier 350).

In the charge storing step α2, α4 and c4 of SW4 are connected to each other and then α2 and c2 of SW2 are connected to each other. The connection between α4 and c4 of SW4 allows the storage of charge in C2, causing the operational amplifier 350 to act as a unity gain buffer. FIG. 2(b) illustrates the equivalent circuit in this step. At this point, the operational amplifier 350 has an output Vopa,1 that is expressed as follows:

Formula 2

$$Vopa, 1 = A(Vofop - Vopa, 1) \quad (3)$$
$$Vopa, 1 = \frac{A}{A+1}Vofop$$

Moreover, a voltage difference between the reference voltage Vref and Vopa,1 is applied to C1. Charges Q1a,1, Q2a,1, and Qpa,1 stored in C1, C2, and Cp in this step are expressed as follows:

Formula 3

$$Q1a, 1 = C1\left(Vref - \frac{A}{A+1}Vofop\right) \quad (4)$$

$$Q2a, 1 = Q2, 0 = C2\left(\frac{A}{A+1}Vopb,0 - Vofop\right) \quad (5)$$

$$Qpa, 1 = Cp\frac{A}{A+1}Vofop \quad (6)$$

In the charge transfer step α3, α4 and c4 of SW4 are connected to each other and then α1 and c1 of SW1 are connected to each other. If the operational amplifier 350 has an output Vopb,1 in this step, charges Q1b,1, Q2b,1, and Qpb,1 stored in C1, C2, and Cp are expressed as follows:

Formula 3

$$Q1b, 1 = -C1\left(-\frac{1}{A}Vopb,1 + Vofop\right) \quad (7)$$

$$Q2b, 1 = C2\left(\frac{A+1}{A}Vopb,1 + Vofop\right) \quad (8)$$

$$Qpb, 1 = Cp\left(-\frac{1}{A}Vopb,1 + Vofop\right) \quad (9)$$

A charge that builds up in the capacitor connected to the negative input of the operational amplifier 350 is stored before and after the charge transfer step α3. Thus, Vopb,1 and Vop,0 are expressed by the following relational expressions:

Formula 5

$$-Q1a,1 + Qpa,1 - Q2a,1 = -Q1b,1 + Qpb,1 - Q2b,1 \quad (10)$$

$$-C1\left(Vref - \frac{A}{A+1}Vofop\right) + Cp\frac{A}{A+1}Vofop -$$

$$C2\left(\frac{A+1}{A}Vop,0 - Vofop\right) = C1\left(-\frac{1}{A}Vopb,1 + Vofop\right) +$$

$$Cp\left(-\frac{1}{A}Vopb,1 + Vofop\right) - C2\left(\frac{A+1}{A}Vopb,1 - Vofop\right)$$

$$\left(\frac{C1}{A} + \frac{Cp2}{A} + \frac{A+1}{A}C2\right)Vopb,$$

$$1 = C1\left(Vref - \frac{A}{A+1}Vofop + Vofop\right) + C2\frac{A+1}{A}Vop,$$

$$0 + Cp\left(Vofop - \frac{A}{A+1}Vofop\right)$$

$$Vofop,1 = \frac{AC1}{C1+Cp+(A+1)C2}\left(Vref + \frac{1}{A+1}Vofop\right) +$$

$$\frac{(A+1)C2}{C1+Cp+(A+1)C2}Vop,0 + \frac{Cp}{C1+Cp+(A+1)C2}\frac{A}{A+1}Vofop$$

At the time of a transition to the initialization and comparing step α1 again, charges Q2,1 and Qp,1 stored in C2 and Cp are expressed by replacing Vop,0, Q2,0, and Qp,0 with Vop,1, Q2,1, and Qp,1, respectively, in Expressions (1) and (2). Charges building up in the capacitors connected to the negative input of the operational amplifier 350 are stored before and after the transition to the initialization and comparing step α1. Thus, Vop,1 and Vopb,1 are expressed by the following relational expressions:

Formula 5

$$Qpb,1 - Q2b,1 = Qp,1 - Q2,1 \quad (11)$$

$$Cp\left(-\frac{1}{A}Vopb,1 + Vofop\right) - C2\left(\frac{A+1}{A}Vopb,1 - Vofop\right) =$$

$$Cp\left(-\frac{1}{A}Vop,1 + Vofop\right) - C2\left(-\frac{A+1}{A}Vop,1 - Vofop\right)$$

$$Vop,1 = Vopb,1$$

Hence, Vopb,1 and Vop,0 are expressed by the following relational expression:

Formula 7

$$Vop,1 = \frac{AC1}{C1+Cp+(A+1)C2}\left(Vref + \frac{1}{A+1}Vofop\right) + \quad (12)$$

$$\frac{(A+1)C2}{C1+Cp+(A+1)C2}Vop,0 + \frac{Cp}{C1+Cp+(A+1)C2}\frac{A}{A+1}Vofop$$

The relational expression of Vop,0 and Vop,1 is defined in a format of a geometric series.

Formula 8

$$Vop,1 + B0 = B1(Vop,0 + B0)$$

$$Vop,1 = B1 Vop,0 + (B1-1)B0 \quad (13)$$

According to a comparison between Expression (12) and Expression (13), B1 is expressed as follows:

Formula 9

$$B1 = \frac{(A+1)C2}{C1+Cp+(A+1)C2} = 1 - \frac{C1+Cp}{C1+Cp+(A+1)C2} = 1 - \eta \quad (14)$$

$$\eta = \frac{C1+Cp}{C1+Cp+(A+1)C2} \quad (15)$$

Moreover, (B1−1)B0=−ηB0 is expressed as follows:

Formula 10

$$-\eta B0 = \frac{AC1}{C1+Cp+(A+1)C2}\left(Vref + \frac{1}{A+1}Vofop\right) + \quad (16)$$

$$\frac{Cp}{C1+Cp+(A+1)C2}\frac{A}{A+1}Vofop$$

When the operations of the initialization and comparing step α1, the charge storing step α2, and the charge transfer step α3 are repeated k times, the operational amplifier 350 has an output Vop,k that is expressed as follows:

Formula 11

$$Vop,k + B0 = B1^k(Vop,0 + B0)$$

$$Vop,k = B1^k(Vop,0+B0) - B0 = (1-\eta)^k(Vop,0+B0) - B0 \quad (17)$$

If C1 and C2 and the gain A of the operational amplifier 350 are designed to satisfy C1<<(A+1)C2, η<<1 is determined. In this case, Expression (17) is expanded to the linear term of η by Maclaurin expansion, obtaining the following expression:

Formula 12

$$Vop,k = (1-k\eta)(Vop,0+B0) - B0 = Vop,0 - k\eta(Vop,0+B0) \quad (18)$$

Before the charge storing step α2 and the charge transfer step α3 are performed for the first time, SW3 is short-circuited and opened by the RST signal of FIG. 1 at least one time, so that a charge stored in C2 is 0. Thus, the initial value Vop,0 is expressed by Expression (1) as follows:

Formula 13

$$Vop,0 = \frac{A}{A+1}Vofop \quad (19)$$

Expressions (14), (16), and (19) are substituted into Expression (18) and are expressed as follows:

Formula 14

$$Vop, k = Vop, 0 - k\eta(Vop, 0 + B0) \quad (20)$$

$$Vop, k = \frac{A}{A+1}Vofop + k\left\{-\frac{C1+Cp}{C1+Cp+(A+1)C2}\frac{A}{A+1}Vofop + \frac{AC1}{C1+Cp+(A+1)C2}\left(Vref + \frac{1}{A+1}Vofop\right) + \frac{Cp}{C1+Cp+(A+1)C2}\frac{A}{A+1}Vofop\right\}$$

$$Vop, k = k\frac{AC1}{C1+Cp+(A+1)C2}Vref + \frac{A}{A+1}Vofop$$

Figure 3:
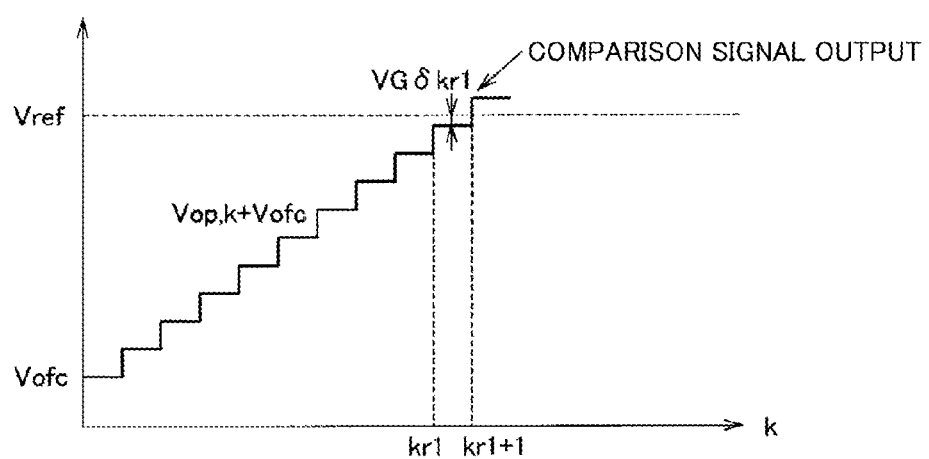
FIG. 3 is a schematic diagram of an operation of a comparator in FIG. 1.

On the assumption that an offset voltage is placed between the positive and negative inputs of the comparator 34, the offset voltage is equivalently applied between the positive and negative inputs of the comparator 34 and an offset voltage Vofc is added to the positive input of the comparator 34 in the following model. When s11 and s13 are connected to each other and s12 and s14 are connected to each other in the crossbar switch 33, the output of the operational amplifier 350 is coupled to the positive input of the comparator 34 and Vref is coupled to the negative input of the comparator 34. Because of the influence of the offset voltage Vofc of the positive input of the comparator 34, the magnitude of Vopb,k+Vofc is compared with the magnitude of Vref in the comparator 34. FIG. 3 indicates an image of comparison in the comparator 34. The horizontal axis of FIG. 3 indicates k, the number of integrations, a broken line parallel to the horizontal axis indicates the negative input (Vref), and a stepped solid line indicates Vopb,k+Vofc. As k indicating the number of integrations increases, Vopb,k+Vofc increases toward Vref. If the number of integrations at the first output of a comparison signal is kr1+1, kr1 is defined as a first number of offset cancellation integrations. Regarding kr1, the first number of offset cancellation integrations, the following equations are established:

Formula 15

$$Vref = VGr(kr1 + \delta kr1) + Vofopb + Vofc \quad (21)$$

$$VGr = \frac{AC1}{C1+Cp+(A+1)C2}Vref \quad (22)$$

$$Vofopb = \frac{A}{A+1}Vofop \quad (23)$$

In Expression (21), the left side is the negative input voltage of the comparator 34 and the right side is a voltage determined by adding the offset voltage of the comparator 34 to a positive input voltage. δkr1 indicates a real number of 0 to less than 1 and VGδkr1 indicates a difference between the output of the operational amplifier 350 and the offset voltage of the comparator 34 at Vref and when the number of integrations is kr1.

When s11 and s14 are connected to each other and α12 and s13 are connected to each other in the crossbar switch 33, Vref is coupled to the positive input of the comparator 34 and the output of the operational amplifier 350 is coupled to the negative input of the comparator 34. In this case, the positive input is large when the number of integrations is small, so that the comparison signal is output. After the charge transfer step and the charge storing and comparing steps are repeated, if the number of integrations at the first stop of the output of the comparison signal is kr2+1 while s11 and s14 are connected to each other and s12 and s13 are connected to each other in the crossbar switch 33, kr2 is defined as a second number of offset cancellation integrations. Regarding kr2, the second number of offset cancellation integrations, the following equation is established:

Formula 16

$$VGr(kr2+\delta kr2)+Vofopb = Vref+Vofc \quad (24)$$

In Expression (24), the left side is the negative input voltage of a determiner and the right side is a voltage determined by adding the offset voltage of the comparator to a positive input voltage. δkr2 indicates a real number of 0 to less than 1.

In the integration-unit measurement processing unit 211, a4 and b4 of SW4 are first connected to each other, and then SW3 is connected to reset charge stored in C2. From this point forward, SW4 keeps the connection between α4 and b4. Thereafter, the charge transfer step and the charge storing and comparing steps are repeated to determine the number of integrations at which a determination signal is output while s11 and s13 are connected to each other and s12 and s14 are connected to each other in the crossbar switch 33.

In the charge storing and comparing steps performed by the integration-unit measurement processing unit 211, a1 and b1 of SW1 are connected to each other and a2 and b2 of SW2 are connected to each other. In the charge transfer step, a1 and c1 of SW1 are connected to each other and a2 and c2 of SW2 are connected to each other. If the output of the operational amplifier 350 is Vop,0 in the charge storing and comparing steps, a charge Q1,0 stored in the capacitor C1 is expressed as follows:

Formula 17

$$Q1,0 = C1\,Vref \quad (25)$$

Moreover, charges Q2,0 and Qp,0 stored in the capacitors C2 and Cp are equal to those of Expression (1) and Expression (2).

If the operational amplifier 350 has an output Vopa,1 in the charge transfer step, charges Q1a,1, Q2a,1, and Qpa,1 stored in the capacitors C1, C2, and Cp are expressed follows:

Formula 18

$$Q1a, 1 = -C1\left(Vofop - \frac{Vopa, 1}{A}\right) \quad (26)$$

$$Q2a, 1 = C2\left(Vop,1 - Vofop + \frac{Vopa, 1}{A}\right) \quad (27)$$

$$Qpa, 1 = Cp\left(-\frac{Vopa, 1}{A} + Vofop\right) \quad (28)$$

In the absence of a path for drawing charge to the power supply or the ground before and after the charge transfer step, the conservation of charge holds true and the following expression is established:

Formula 19

$$-W1,0+Op,0-Op,0=-Q1a,1+Qpa,1-Q2a,1 \quad (29)$$

By substituting the Expressions (1), (2), (25), (26), (27), and (28) into Expression (29), the relational expressions of Vop,0 and Vop,1 can be derived as follows:

Formula 20

$$-C1\,Vref + Cp\left(-\frac{Vop,0}{A} + Vofop\right) - C2\left(Vop,0 - Vofop + \frac{Vop,0}{A}\right) = \qquad (30)$$

$$C1\left(Vofop - \frac{Vopa,1}{A}\right) + Cp\left(-\frac{Vopa,1}{A} + Vofop\right) -$$

$$C2\left(Vopa,1 - Vofop + \frac{Vopa,1}{A}\right)\left(\frac{C1}{A} + \frac{Cp}{A} + \frac{A+1}{A}C2\right)Vopa,$$

$$1 = C1(Vref + Vofop) + \left(\frac{Cp}{A} + C2\frac{A+1}{A}\right)Vop,0$$

$$Vopa,1 =$$

$$\frac{AC1}{C1 + Cp + (A+1)C2}(Vref + Vofop) + \frac{Cp(A+1)C2}{C1 + Cp + (A+1)C2}Vop,0$$

If the output of the operational amplifier is Vop,1 in the transition to the subsequent charge storing and comparing steps, charges stored in the capacitors C2 and Cp are expressed by replacing Q2,0 in Expressions (1) and (2) with Q2,1, Qp,0 in Expressions (1) and (2) with Qp,1, and Vop,0 in Expressions (1) and (2) with Vop,1. Charges in the transition to the charge storing and comparing steps are stored and thus an expression is established as follows:

Formula 21

$$Qpa,1-Q2a,1=Op,1-Qp,1 \qquad (31)$$

According to Expression (31), the relational expressions of Vopa,1 and Vop,1 can be derived as follows:

Formula 22

$$Cp\left(-\frac{Vopa,1}{A} + Vofop\right) - C2\left(\frac{A+1}{A}Vopa,1 - Vofop\right) = \qquad (32)$$

$$Cp\left(-\frac{Vop,1}{A} + Vofop\right) - C2\left(\frac{A+1}{A}Vop,1 - Vofop\right)$$

$$Vop,1 = Vopa,1$$

Hence, Vop,1 and Vop,0 are expressed by the following relational expression:

Formula 23

$$Vop,1 = \qquad (33)$$

$$\frac{AC1}{C1 + Cp + (A+1)C2}(Vref + Vofop) + \frac{Cp(A+1)C2}{C1 + Cp + (A+1)C2}Vop,0$$

As in the derivation of Expression (20), by expansion using Expression (18) obtained by Maclaurin expansion on the geometric-series expression in Expression (17), the output of the operational amplifier 350 when the charge storing and comparing steps and the charge transfer step are repeated k times is expressed using B1, η, and −ηB0 as follows:

Formula 24

$$B1 = \frac{Cp(A+1)C2}{C1 + Cp + (A+1)C2} = 1 - \frac{C1}{C1 + Cp + (A+1)C2} = 1 - \eta \qquad (34)$$

$$\eta = \frac{C1}{C1 + Cp + (A+1)C2} \qquad (35)$$

$$-\eta B0 = \frac{AC1}{C1 + Cp + (A+1)C2}(Vref + Vofop) \qquad (36)$$

$$Vop,k = k\left(Vref + \frac{1}{A+1}Vofop\right) + \frac{A}{A+1}Vofop \qquad (37)$$

$$VG = \frac{AC1}{C1 + Cp + (A+1)C2}\left(Vref + \frac{A}{A+1}Vofop\right) \qquad (38)$$

When s11 and s13 are connected to each other and s12 and s14 are connected to each other in the crossbar switch 33, the output of the operational amplifier 350 is coupled to the positive input of the comparator 34 and Vref is coupled to the negative input of the comparator 34.

As in the explanation of FIG. 3, as the number of integrations increases, Vopb,k+Vofc increases toward Vref. If the number of integrations at the first detection of the comparison signal is ki+1, ki is defined as a first number of integrations. ki1 indicating the first number of integrations holds for Expression (39).

Formula 25

$$Vref=VG(ki1+\delta ki1)+Vofopb+Vofc \qquad (39)$$

According to Expressions (22) and (38), the following expression is established:

Formula 26

$$VG = \frac{Vref + Vofopb}{Vref}VGr \qquad (40)$$

In order to simplify the expansion of the expression, Kr1=kr1+δkr1, Kr2=kr2+δkr2, and Ki1=ki1+δki1 are determined. A difference between Expression (21) and Expression (39) is determined and then Expression (40) is substituted, so that an expression for Vofopb is obtained as follows:

Formula 27

$$0 = VGr\,Kr1 - VG\,Ki1 \qquad (41)$$

$$0 = VGr\,Kr1 - \frac{Vref + Vofopb}{Vref}VGr\,Ki1$$

$$0 = Vref\,Kr1 - (Vref + Vofopb)Ki1$$

$$Vofopb = \frac{Kr1 - Ki1}{Ki1}Vref$$

A difference between Expression (21) and Expression (24) is determined so as to obtain an expression for VGr as follows:

Formula 28

$$Vref - VGr\,Kr2 - Vofopb = VGr Kr1 + Vofopb - Vref \quad (42)$$
$$(Kr1 + Kr2)VGr = 2(Vref - Vofopb)$$
$$VGr = \frac{2(Vref - Vofopb)}{Kr1 + Kr2}$$

Vofopb and VGr are determined by the median value of the range of Vofopb and VGr.

Expression (41) is partially differentiated with respect to δkr1 and δki1, obtaining the following expressions:

Formula 29

$$\frac{\partial Vofopb}{\partial(\delta kr1)} = \frac{1}{Ki1}Vref > 0 \quad (43)$$

$$\frac{\partial Vofopb}{\partial(\delta ki1)} = -\frac{Kr1}{Ki1^2}Vref < 0 \quad (44)$$

According to Expressions (43) and (44), Vofopb monotonously increases with respect to δkr1 and monotonously decreases with respect to δki1. Thus, the range of Vofopb is expressed by the following expression:

Formula 30

$$\frac{kr1 - ki1 - 1}{ki1 + 1}Vref < Vofopb < \frac{kr1 - ki1 + 1}{ki1}Vref \quad (45)$$

If Vofopb is set at Vofopc that is expressed by Expression (46) as the median value of the range of Expression (45), the calibrated value of Vofopb can be derived with accuracy lower than ΔVofopb expressed by Expression (47).

Formula 31

$$Vofopc = \frac{kr1 - ki1 + 1}{2ki1}Vref + \frac{kr1 - ki1 - 1}{2(ki1 + 1)}Vref \quad (46)$$

$$\Delta Vofopb = \frac{kr1 - ki1 + 1}{2ki1}Vref - \frac{kr1 - ki1 - 1}{2(ki1 + 1)}Vref \quad (47)$$

Expression (42) is partially differentiated with respect to δkr1, δkr2, and δki1, obtaining the following expressions:

Formula 32

$$\frac{\partial VGr}{\partial(\delta kr1)} = -\frac{2(Vref - Vofopb)}{(Kr1 + Kr2)^2} - \frac{2}{Kr1 + Kr2}\frac{\partial Vofopb}{\partial(\delta kr1)}Vref < 0 \quad (48)$$

$$\frac{\partial VGr}{\partial(\delta kr2)} = -\frac{2(Vref - Vofopb)}{(Kr1 + Kr2)^2} < 0 \quad (49)$$

$$\frac{\partial VGr}{\partial(\delta ki1)} = -\frac{2}{Kr1 + Kr2}\frac{\delta Vofopb}{\partial(\delta ki1)} > 0 \quad (50)$$

As for the inequality signs of Expression (48), Vref>Vofopb and ∂Vofopb/∂(δkr1)>0 are used. As for the inequality sign of Expression (49), Vref>Vofopb is used. As for the inequality sign of Expression (50), ∂Vofopb/∂(δki1) <0 is used. According to Expression (48), Expression (49), and Expression (50), VGr monotonously decreases with respect to δkr1 and δkr2 and monotonously increases with respect to δki1. Thus, the range of VGr is expressed by the following expression:

Formula 33

$$\frac{2Vref}{Kr1 + Kr2 + 2}\frac{2Ki1 - Kr1 - 1}{Ki1} < VGr < \frac{2Vref}{Kr1 + Kr2}\frac{2Ki1 - Kr1 + 2}{Ki1 + 1} \quad (51)$$

If VGr is set at VGrc that is expressed by Expression (52) as the median value of the range of Expression (51), the calibrated value of VGr can be derived with accuracy lower than ΔVGr expressed by Expression (53).

Formula 34

$$VGrc = \frac{Vref}{Kr1 + Kr2}\frac{2Ki1 - Kr1 + 2}{Ki1 + 1} + \frac{Vref}{Kr1 + Kr2 + 2}\frac{2Ki1 - kr1 - 1}{Ki1} \quad (52)$$

$$\Delta VGr = \frac{Vref}{Kr1 + kr2}\frac{2Ki1 - Kr1 + 2}{Ki1 + 1} - \frac{Vref}{Kr1 + Kr2 + 2}\frac{2Ki1 - kr1 - 1}{Ki1} \quad (53)$$

As described above, even if the offset or gain of the operational amplifier 350, a capacity constituting an integration unit voltage, or the like is changed by aging, the processing in a calibrated state can derive Vofopb appearing on the output of the operational amplifier 350 as the offset of the operational amplifier 350 and the integration unit voltage VGr with predetermined accuracy.

In a converted state, a10 and c10 of the switching unit are connected to each other. An input signal is held in the sample-hold unit 31 and SW3 is connected to reset the charge of C2. Thereafter, by the same processing as the offset-cancellation measurement processing unit 210 in a calibrated state, the number of integrations is determined so as to satisfy the following condition: when s11 and s13 are connected to each other and s12 and s14 are connected to each other in the crossbar switch 33 and when s11 and s14 are connected to each other and s12 and s13 are connected to each other in the crossbar switch 33, the magnitude of the output of the integrating unit 35 is equal to that of the held input signal.

Like the offset-cancellation measurement processing unit 210 in a calibrated state, the conversion control unit 22 repeats the initialization and comparing step, the charge storing step, and the charge transfer step. When the number of repetitions reaches k, the output Vop,k of the integrating unit 35 is expressed by Expression (20). If the sample-hold unit 31 holds a voltage Vin, Vin is inputted to the negative input of the comparator 34 and Vop,k is inputted to the positive input of the comparator 34 when s11 and s13 are connected to each other and s12 and s14 are connected to each other in the crossbar switch 33. In this case, if the number of integrations is km1 when the comparison signal is first output from the comparator 34, the following expression is established:

Formula 35

$$Vin = VGr(km1 + \delta km1) + Vofopb + Vofc \quad (54)$$

δkm1 indicates a real number of 0 to less than 1 and VGrδkm1 indicates a difference between Vin and the sum of the output of the integrating unit 35 and the offset of the comparator 34 when the number of integrations is km1.

When s11 and s14 are connected to each other and s12 and s13 are connected to each other in the crossbar switch 33, Vop,k is inputted to the negative input of the comparator 34 and Vin is inputted to the positive input of the comparator 34. In this case, the positive input of the comparator is larger when the number of integrations is small, so that the comparison signal is output. If the number of integrations increases and reaches km2 when the comparison signal is first stopped from the comparator, the following expression is established:

Formula 36

$$VGr(km2+\delta km2)+Vofopb=Vin+Vofo \quad (55)$$

δkm2 indicates a real number of 0 to less than 1 and VGrδkm2 indicates a difference between the sum of Vin and the offset of the comparator and the output of the integrating unit 35 when the number of integrations is km1.

A difference between Expression (54) and Expression (55) is determined to cancel the offset Vofc of the comparator 34, obtaining expressions as follows:

Formula 37

$$Vin - VGr(km2 + \delta km2) - Vofopb = \quad (56)$$
$$VGr(km1 + \delta km1) + Vofopb - Vin$$
$$Vin = \frac{VGr}{2}(km1 + \delta km1 + km2 + \delta km2) + Vofopb$$

Vin monotonously increases with respect to δkm1 and δkm2. Since δkm1 and δkm2 are real numbers of 0 to less than 1, Vin is placed within the following range:

Formula 38

$$\frac{VGr}{2}(km1 + km2) + Vofopb \leq Vin < \frac{VGr}{2}(km1 + km2 + 2) + Vofopb \quad (57)$$

If Expression (58) indicating the median value of Expression (57) is determined as Vin, Vin is determined with the accuracy of Expression (59). At this point, calibrated values derived from Expression (52) and Expression (46) are used for VGr and Vofopb.

Formula 39

$$Vin = \quad (58)$$
$$\frac{1}{2}\left\{\frac{VGr}{2}(km1 + km2 + 2) + Vofopb + \frac{VGr}{2}(km1 + km2) + Vofopb\right\}$$

$$\Delta Vin = \quad (59)$$
$$\frac{1}{2}\left\{\frac{VGr}{2}(km1 + km2 + 2) + Vofopb - \frac{VGr}{2}(km1 + km2) + Vofopb\right\}$$

As described above, the AD converter 100 with a self-calibration function according to the present embodiment is an AD converter with a self-calibration function that eliminates the need for a measuring device for calibration. The AD converter 100 is provided with the control unit 20 including the calibration control unit 21 that controls an operation for calibrating the control unit 20 and the conversion control unit 22 that controls an operation for converting a target input voltage into a digital signal, the reference voltage unit 10 that outputs the reference voltage Vref, the integrating unit 35 that generates an integrated voltage by integrating a predetermined unit voltage, and the integrating converter unit 30, which will be described below. In this configuration, the integrating converter unit 30 includes the comparator 34 that has two inputs and compares an integrated voltage and an input voltage or the reference voltage Vref, and the crossbar switch 33 that switches connections between the case where an integrated voltage is inputted to one of the inputs of the comparator 34 and an input voltage or the reference voltage Vref is inputted to the other input and the case where an input voltage or the reference voltage Vref is inputted to one of the inputs of the comparator 34 and an integrated voltage is inputted to the other input.

This can provide the AD converter with a self-calibration function that eliminates the need for a measuring device for calibration outside the AD converter.

Moreover, the integrating unit 35 includes the operational amplifier 350. The calibration control unit 21 causes the integrating unit 35 to generate an integrated voltage by integrating a unit voltage from which the offset voltage of the operational amplifier 350 is removed. The calibration control unit 21 compares, by switching the connections of the crossbar switch 33, the reference voltage Vref and the integrated voltage generated by integrating the unit voltage from which the offset voltage of the operational amplifier 350 is removed. Moreover, the calibration control unit 21 causes the integrating unit 35 to generate an offset integrated voltage by integrating the unit voltage including the offset voltage of the operational amplifier 350, with the offset-cancellation measurement processing unit 210 that acquires kr1, the first number of offset cancellation integrations and kr2, the second number of offset cancellation integrations. Furthermore, the calibration control unit 21 includes the integration-unit measurement processing unit 211 that causes the comparator 34 to compare the generated offset integrated voltage and the reference voltage Vref and acquires ki1, the first number of integrations. The conversion control unit 22 converts an input voltage to a digital signal by using the calibrated value of the offset voltage of the operational amplifier 350 based on kr1, kr2, and ki1 and the calibrated value of the unit voltage from which the offset voltage of the operational amplifier 350 is removed.

The integrating unit 35 includes the first capacitor C1 for holding the unit voltage, the second capacitor C2 for holding the integrated voltage, the first switch SW1 for connecting one of the terminals of the first capacitor C1 to the positive input terminal of the operational amplifier 350 connected to the reference voltage Vref or the ground voltage, the second switch SW2 for connecting the other terminal of the first capacitor C1 to the ground voltage or the negative input terminal of the operational amplifier 350, the third switch SW3 for connecting both terminals of the second capacitor C2, and the fourth switch SW4 for connecting the other terminal of the second capacitor C2 or the negative input terminal of the operational amplifier 350 to the output terminal of the operational amplifier 350. After the negative input terminal of the operational amplifier 350 and the output terminal of the operational amplifier 350 are connected to each other via the fourth switch SW4, the offset-cancellation measurement processing unit 210 connects the other terminal of the first capacitor C1 to the negative input terminal of the operational amplifier 350 via the second switch SW2.

The offset-cancellation measurement processing unit 210 determines the median value of a unit voltage range as a calibrated value of the unit voltage, the range being obtained by the relationship with the unit voltage that monotonously decreases with respect to kr1 and kr2 and monotonously increases with respect to ki1 and the setting of a predetermined width for kr1, kr2, and ki1, and the offset-cancellation measurement processing unit 210 determines the median value of the offset voltage range of the operational amplifier 350 as a calibrated value of the offset voltage of the operational amplifier 350, the range being obtained by the relationship with the offset voltage of the operational amplifier 350 and the setting of a predetermined width for kr1 and ki1, the offset voltage monotonously increasing with respect to kr1 and monotonously decreasing with respect to ki1.

Even if the offset of the comparator 34, the offset or gain of the operational amplifier 350, a capacity constituting an integration unit, or the like is changed by aging, the AD converter 100 with a self-calibration function according to the present embodiment can calibrate the offset of the comparator 34 and the integrating unit 35 acting as an analog-value output unit for a DA converter, so that the AD converter can be provided with long-term stability.

In the above description, the calibrated values of Vofopb and VGr are set at the median values of the ranges expressed by Expressions (45) and (51). Kr1, Kr2, and Ki1 in Expression (41) and Expression (42) may be replaced with kr1, kr2, and ki1.

(Modification)

Figure 4:
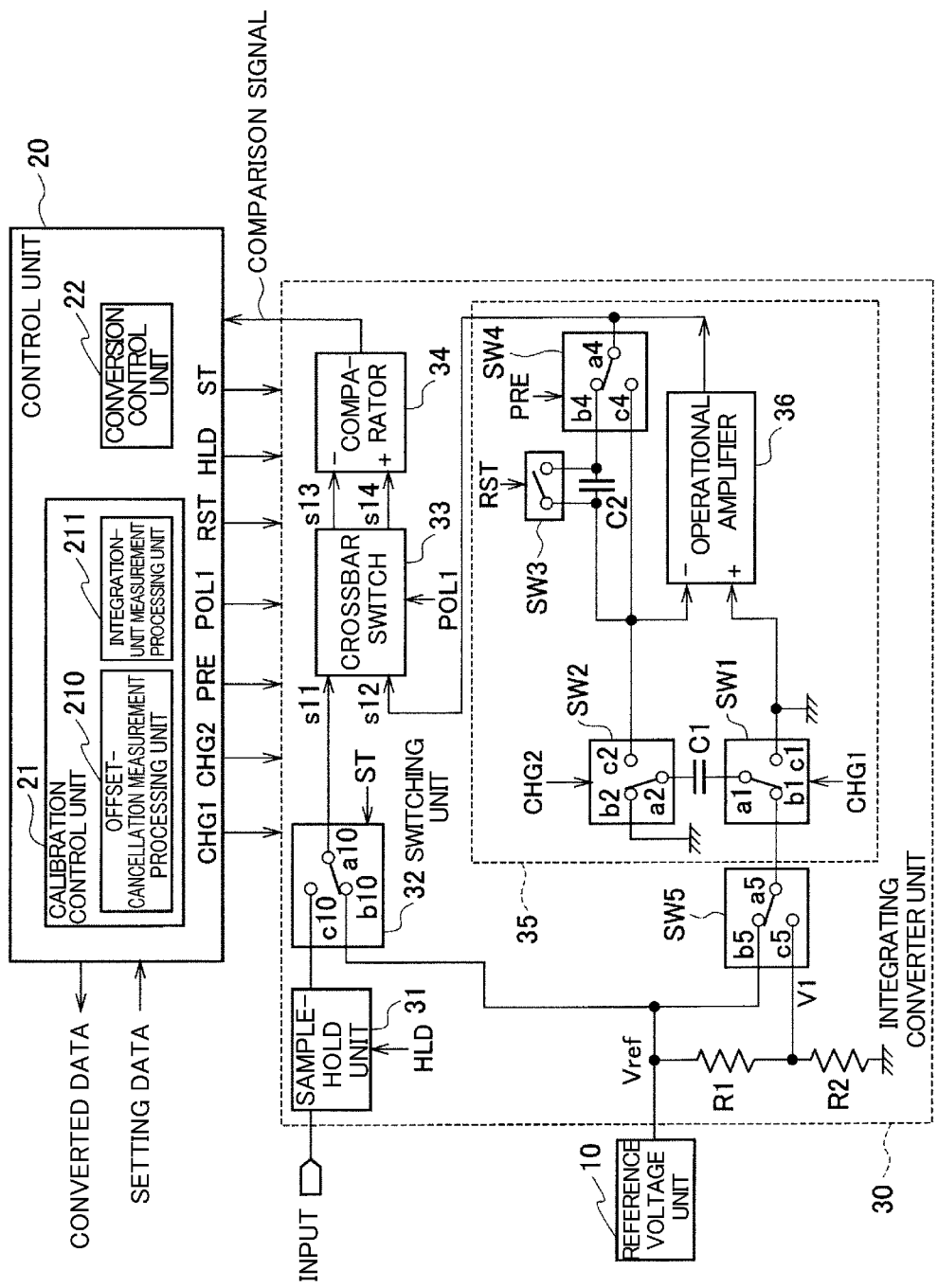
FIG. 4 is a functional block diagram illustrating a configuration example of a modification of the AD converter with a self-calibration function in FIG. 1.

In the AD converter 100 with a self-calibration function in FIG. 1, the reference voltage is the integration unit voltage. An intermediate potential may be used to reduce the integration unit voltage. FIG. 4 illustrates a modification of the AD converter 100 with a self-calibration function.

In the modification of FIG. 4, an intermediate potential V1 is generated by the voltage division of resistors R1 and R2. In a calibrated state of this configuration, offset cancellation measurement processing, integration unit measurement processing, and intermediate-potential integration unit measurement processing are sequentially performed while a10 and b10 of the switching unit are connected to each other, so that an integration unit voltage is calibrated when the offset voltage of the operational amplifier 350 and the intermediate potential V1 are used. The offset cancellation measurement processing and the integration unit measurement processing are identical to the processing of FIG. 1 except for the connection of a5 and b5 of SW5 and thus the explanation thereof is omitted.

The intermediate-potential integration unit measurement processing includes, like the offset cancellation measurement processing, the initialization and comparing step, the charge storing step, and the charge transfer step while a5 and c5 of SW5 are connected to each other. SW3 is first connected to initialize the charge of C2 to 0, a1 and b1 of SW1 are connected to each other, a2 and b2 of SW2 are connected to each other, a4 and b4 of SW4 are connected to each other, and SW3 is disconnected. From the first initialization, SW3 is kept disconnected.

Unlike in the offset cancellation measurement processing, SW5 connects C1 to the intermediate potential V1 instead of the reference voltage Vref. The charge Q1a,1 stored in C1 is expressed as follows:

Formula 40

$$Q1a, 1 = C1\left\{V1 - \frac{A}{A+1}Vofop\right\} \quad (60)$$

The charges Q2a,1 and Qpa,1 stored in C2 and Cp are equal to those of Expression (5) and Expression (6).

In the charge transfer step, the charges Q1b,1, Q2b,1, and Qpb,1 stored in C1, C2, and Cp are equal to those of Expression (7), Expression (8), and Expression (9).

A charge that builds up in the capacitor connected to the negative input of the operational amplifier 350 is stored before and after the charge transfer step. Thus, Vopb,1 and Vop,0 are expressed by the following relational expressions:

Formula 41

$$-Q1a, 1 + Qpa, 1 - Q2a, 1 = -Q1b, 1 + Qpb, 1 - Q2b, \quad (61)$$

$$1 - C1\left\{V1 - \frac{A}{A+1}Vofop\right\} + Cp\frac{A}{A+1}Vofop -$$

$$C2\left\{\frac{A+1}{A}Vopb, 0 - Vofop\right\} = C1\left\{-\frac{1}{A}Vopb, 1 + Vofop\right\} +$$

$$Cp\left\{-\frac{1}{A}Vopb, 1 + Vofop\right\} - C2\left\{\frac{A+1}{A}Vopb, 1 - Vofop\right\}$$

$$\left(\frac{C1}{A} + \frac{Cp2}{A} + \frac{A+1}{A}C2\right)Vopb,$$

$$1 = C1\left(V1 + \frac{A}{A+1}Vofop\right) + C2\frac{A+1}{A}Vop,$$

$$0 + Cp\frac{A}{A+1}Vofop$$

$$Vopb, 1 = \frac{AC1}{C1+Cp+(A+1)C2}\left(V1 + \frac{A}{A+1}Vofop\right) +$$

$$\frac{(A+1)C2}{C1+Cp+(A+1)C2}Vop, 0 + \frac{Cp}{C1+Cp+(A+1)C2}\frac{A}{A+1}Vofop$$

At the time of a transition to the initialization and comparing step again, the same operation is performed as in FIG. 1. Thus, the relationship between the outputs Vop,1 and Vopb,1 of the operational amplifier 350 is identical to that of Expression (11). Hence, Vopb,1 and Vop,0 are expressed by the following relational expression:

Formula 42

$$Vop, 1 = \frac{AC1}{C1+Cp+(A+1)C2}\left(V1 + \frac{1}{A+1}Vofop\right) + \quad (62)$$

$$\frac{(A+1)C2}{C1+Cp+(A+1)C2}Vop, 0 + \frac{Cp}{C1+Cp+(A+1)C2}\frac{A}{A+1}Vofop$$

According to Expression (62), when the initialization and comparing step, the charge storing step, and the charge transfer step are repeated k times, the output Vop,k of the operational amplifier 350 is expressed as follows:

Formula 43

$$Vop, k = k\frac{AC1}{C1+Cp+(A+1)C2}V1 + \frac{A}{A+1}Vofop \quad (63)$$

$$VGr2 = \frac{AC1}{C1+Cp+(A+1)C2}V1 \quad (64)$$

Also in the intermediate-potential integration unit measurement processing, as in the offset cancellation measurement processing, the reference voltage and the output of the operational amplifier 350 are compared with each other when s11 and s13 are connected to each other and s12 and s14 are connected to each other in the crossbar switch 33 and when s11 and s14 are connected to each other and s12 and s13 are connected to each other in the crossbar switch 33. When s11 and s13 are connected to each other and s12 and s14 are connected to each other in the crossbar switch 33, the output of the operational amplifier 350 is coupled to the positive input of the comparator 34 and the reference voltage Vref is coupled to the negative input of the comparator 34. When the output Vop,k of the operational amplifier 350 is small, the comparison signal is not output from the comparator 34. When Vop,k+Vofc exceeds Vref, the comparison signal is output. The operations of the initialization and comparing step to the charge transfer step are repeated. If the number of integrations at the first detection of the comparison signal is kb1+1, kb1 is defined as a first number of intermediate potential integrations. Regarding kb1 indicating the first number of intermediate potential integrations, the following equation is established:

Formula 44

$$Vref = VGr2(kb1+\delta kb1) + Vofopb + Vofc \qquad (65)$$

In Expression (65), the left side is the negative input voltage of the comparator 34 and the right side is a voltage determined by adding the offset voltage of the comparator 34 to a positive input voltage. $\Delta kb1$ indicates a real number of 0 to less than 1 and $VG2\delta kb1$ indicates a difference between the output of the operational amplifier 350 and the offset voltage of the comparator 34 at Vref and when the number of integrations is kb1.

When s11 and s14 are connected to each other and s12 and s13 are connected to each other in the crossbar switch 33, Vref is coupled to the positive input of the comparator 34 and the output of the operational amplifier 350 is coupled to the negative input of the comparator 34. In this case, the positive input is large when the number of integrations is small, so that the comparison signal is output. The operations of the initialization and comparing step to the charge transfer step are repeated. If the number of integrations at the first stop of the output of the comparison signal is kb2+1, kb2 is defined as a second number of intermediate potential integrations. Regarding kb2 indicating the second number of offset cancellation integrations, the following equation is established:

Formula 45

$$VGr2(kb2+\delta kb2) + Vofopb = Vref + VofC \qquad (66)$$

$\delta kb2$ is a real number of 0 to less than 1.

Since the offset cancellation measurement processing and the integration unit measurement processing are performed as in the example of FIG. 1, kr1, kr2, and ki1 are obtained. kr1 is the first number of offset cancellation integrations, kr2 is the second number of offset cancellation integrations, and ki1 is the first number of integrations. As in the example of FIG. 1, Expression (21), Expression (24), and Expression (39) are established for kr1, kr2, and ki1, respectively. In order to simplify the expansion of the expressions, Expression (41) and Expression (42) are established as Kr1=kr1+δkr1, Kr2=kr2+δkr2, and Ki1=ki1+δki1 between Vofopb and VGr.

Also in Expression (65) and Expression (66), a difference between a difference between Expression (65) and Expression (66) and a difference between Expression (21) and Expression (24) is determined as Kb1=kb1+δkb1 and Kb2=kb2+δkb2, so that an expression for VGr2 is obtained as follows:

Formula 46

$$VGKr2 - VGr2Kb2 = VGr2Kb1 - VGKr1 \qquad (67)$$

$$VGr2 = \frac{Kr1 + Kr2}{Kb1 + Kb2}VG = \frac{2(Vref - Vofopb)}{Kb1 + Kb2} = \frac{2Ki1 - Kr1}{(Kb1 + Kb2)Ki1}Vref$$

Vofopb can be obtained by the example of FIG. 1, the offset cancellation measurement, and the integration unit measurement and thus can be determined by Expression (46). Expression (67) is partially differentiated with respect to δkr1, δki1, δkb1, and δkb2, obtaining the following expressions:

Formula 47

$$\frac{\partial VGr2}{\partial(\delta kr1)} = -\frac{2}{Kb1+Kb2}\frac{\partial Vofopb}{\partial(\delta kr1)} < 0 \qquad (68)$$

$$\frac{\partial VGr2}{\partial(\delta ki1)} = -\frac{2}{Kb1+Kb2}\frac{\partial Vofopb}{\partial(\delta kr1)} > 0 \qquad (69)$$

$$\frac{\partial VGr2}{\delta(\delta kb1)} = -\frac{2(Vref - Vofopb)}{(Kb1+Kb2)^2} < 0 \qquad (70)$$

$$\frac{\partial VGr2}{\partial(\delta kb2)} = -\frac{2(Vref - Vofopb)}{(Kb1+Kb2)^2} < 0 \qquad (71)$$

According to Expressions (68) to (71), VGr2 monotonously increases with respect to δki1 and monotonously decreases with respect to δkr1, δkb1, and δkb2.

Formula 48

$$\frac{2ki1 - kr1 - 1}{(kb1+kb2+2)ki1}Vref < VGr2 < \frac{2ki1 - kr1 + 2}{(kb1+kb2)(ki1+1)}Vref \qquad (72)$$

If VGr2 is set at VGr2c that is expressed by Expression (73) as the median value of the range of Expression (72), VGr2 can be derived with accuracy lower than ΔVGr2 expressed by Expression (74).

Formula 49

$$VGr2c = \frac{2ki1 - kr1 + 2}{2(kb1+kb2)(ki1+1)}Vref + \frac{2ki1 - kr1 - 1}{2(kb1+kb2+2)ki1}Vref \qquad (73)$$

$$\Delta VGr2 = \frac{2ki1 - kr1 + 2}{2(kb1+kb2)(ki1+1)}Vref - \frac{2ki1 - kr1 - 1}{2(kb1+kb2+2)ki1}Vref \qquad (74)$$

As described above, even if the offset or gain of the operational amplifier 350, a capacity constituting an integration unit voltage, or the like is changed by aging, the processing in a calibrated state can derive Vofopb appearing on the output of the operational amplifier 350 as the offset of the operational amplifier 350 and the integration unit voltage VGr with predetermined accuracy.

In a converted state, a10 and c10 of the switching unit 32 are connected to each other and a5 and c5 of SW5 are connected to each other. An input signal is held in the sample-hold unit 31 and SW3 is connected to reset the charge of C2. Thereafter, by the same processing as in the intermediate-potential integration unit measurement processing, the number of integrations is determined so as to satisfy the following condition: when s11 and s13 are connected to each other and s12 and s14 are connected to each other in the crossbar switch 33 and when s11 and s14 are connected to each other and s12 and s13 are connected to each other in the crossbar switch 33, the magnitude of the output of the integrating unit 35 is equal to that of the held input signal.

When the initialization and comparing step, the charge storing step, and the charge transfer step of the intermediate-potential integrated unit measurement are repeated k times, the output Vop,k of the integrating unit 35 is expressed by Expression (63). If the sample-hold unit 31 holds a voltage Vin, Vin is inputted to the negative input of the comparator 34 and Vop,k is inputted to the positive input of the comparator 34 when s11 and s13 are connected to each other and s12 and s14 are connected to each other in the crossbar switch 33. In this case, if the number of integrations is km1 when the comparison signal is first output from the comparator 34, the following expression is established:

Formula 50

$$Vin = VGr2(km1 + \delta km1) + Vofopb + Vofc \quad (75)$$

δkm1 indicates a real number of 0 to less than 1 and VGr2δkm1 indicates a difference between Vin and the sum of the output of the integrating unit 35 and the offset of the comparator 34 when the number of integrations is km1.

When s11 and s14 are connected to each other and s12 and s13 are connected to each other in the crossbar switch 33, Vop,k is inputted to the negative input of the comparator 34 and Vin is inputted to the positive input of the comparator 34. In this case, the positive input of the comparator 34 is larger when the number of integrations is small, so that the comparison signal is output. If the number of integrations increases and reaches km2 when the comparison signal is first stopped from the comparator, the following expression is established:

Formula 51

$$VGr2(km2 + \delta km2) + Vofopb = Vin + Vofc \quad (76)$$

δkm2 indicates a real number of 0 to less than 1 and VGrδkm2 indicates a difference between the sum of Vin and the offset of the comparator 34 and the output of the integrating unit 35 when the number of integrations is km1.

A difference between Expression (75) and Expression (76) is determined to cancel the offset Vofc of the comparator 34, obtaining expressions as follows:

Formula 52

$$Vin - VGr2(km2 + \delta km2) - Vofopb = \quad (77)$$
$$VGr2(km1 + \delta km1) + Vofopb - Vin$$
$$Vin = \frac{VGr2}{2}(km1 + \delta km1 + km2 + \delta km2) + Vofopb$$

Vin monotonously increases with respect to δkm1 and δkm2. Since δkm1 and δkm2 are real numbers of 0 to less than 1, Vin is placed within the following range:

Formula 53

$$\frac{VGr2}{2}(km1 + km2) + Vofopb \leq Vin < \frac{VGr2}{2}(km1 + km2 + 2) + Vofopb \quad (78)$$

If Expression (79) indicating the median value of Expression (78) is determined as Vin, Vin is determined with the accuracy of Expression (80).

Formula 54

$$Vin = \frac{1}{2}\left[\frac{VGr2}{2}(km1 + km2 + 2) + Vofopb + \right. \quad (79)$$
$$\left. \frac{VGr2}{2}(km1 + km2) + Vofopb\right]$$
$$= \frac{VGr2}{2}(km1 + km2 + 1) + Vofopb$$

$$\Delta Vin = \frac{1}{2}\left\{\frac{VGr2}{2}(km1 + km2 + 2) + Vofopb - \right. \quad (80)$$
$$\left. \frac{VGr2}{2}(km1 + km2) + Vofopb\right\}$$
$$= \frac{VGr2}{2}$$

As described above, even if the offset of the comparator 34, the offset or gain of the operational amplifier 350, a capacity constituting an integration unit, or the like, is changed by aging, the AD converter with a self-calibration function according to the present embodiment can calibrate the offset of the comparator 34 and the integrating unit 35 acting as an analog-value output unit for a DA converter, so that the AD converter can be provided with long-term stability.

In the above description, Vofopb and VGr are set at the median values of the ranges expressed by Expressions (45) and (72). Kr1, Ki1, Kb1, and Kb2 in Expression (41) and Expression (67) may be replaced with kr1, ki1, kb1, and kb2.

Second Embodiment

Figure 5:
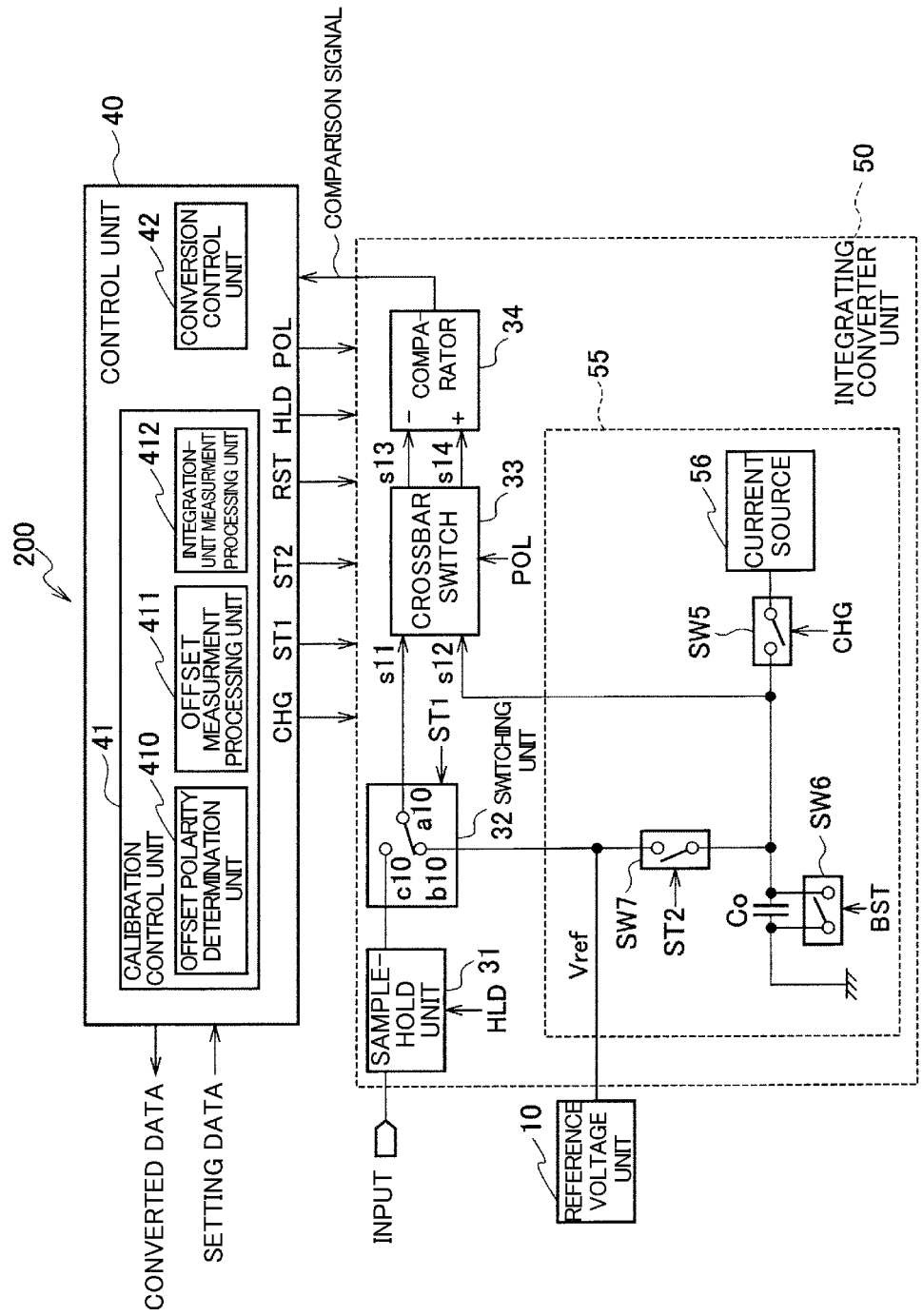
FIG. 5 is a functional block diagram illustrating a configuration example of an AD converter with a self-calibration function according to a second embodiment of the present invention.

FIG. 5 is a functional block diagram illustrating a functional configuration example of an AD converter with a self-calibration function according to a second embodiment of the present invention. An AD converter 200 with self-calibration function in FIG. 5 is different from the AD converter 100 with a self-calibration function (FIG. 1) in the configuration of an integrating unit.

An integrating unit 55 of the AD converter 200 with a self-calibration function includes a unit capacitor Co (hereinafter, will be referred to as Co), a current source 56 for supplying charge to Co, SW5 connected when charge is supplied to Co, SW6 for resetting charge stored in Co, and SW7 connected when the offset of a comparator 34 is determined.

An integrating operation of the present embodiment will be described below. The integrating operation is performed by supplying charge from the current source 56 to Co in a time period equal to an integral multiple of a predetermined time unit. FIG. 6(a) illustrates an equivalent circuit model when s11 and s13 are connected to each other and s12 and s14 are connected to each other in a crossbar switch 33. In the equivalent circuit, an electrode connected to the current source side of Co is a positive electrode (+) and an electrode connected to the ground side is a negative electrode (−). If the predetermined time unit is denoted as Δt, a charge IoκΔt Io supplied from the current source 56 in a time kΔt, which is k times as long as Δt. In consideration of a parasitic capacitance Cp1 on the positive input side of the comparator, the voltage of Co is expressed as follows:

Formula 55

$$Vo = \frac{Io}{Co + Cp1} \Delta tk \quad (81)$$

When s11 and s14 are connected to each other and s12 and s13 are connected to each other in the crossbar switch 33 of FIG. 6(b), a parasitic capacitance Cp2 on the negative input side of the comparator 34 is connected to Co. Thus, a voltage Vo generated by the charge supplied from the current source in the time kΔt, which is k times as long as Δt, is expressed as follows:

Formula 56

$$Vo = \frac{Io}{Co + Cp2} \Delta tk \quad (82)$$

Hence, the voltage Vo is proportionate to an integral multiple k of the predetermined time Δt.

In a calibrated state of the present embodiment, offset polarity determination processing, offset measurement processing, and integration unit measurement processing are sequentially performed while a10 and b10 of a switching unit 32 are connected to each other, so that the offset voltage of the comparator 34 and an integration unit voltage are calibrated.

The offset polarity determination processing is performed by an offset polarity determination unit 410 of a calibration control unit 41. The offset measurement processing and the integration unit measurement processing are performed by an offset measurement processing unit 411 and an integration-unit measurement processing unit 412 of the calibration control unit 41.

In the offset polarity determination processing, SW7 is connected and SW5 and SW6 are disconnected in response to an operation control signal output from a control/processing unit. Moreover, s11 and s13 are connected to each other and s12 and s14 are connected to each other in the crossbar switch 33.

If the offset voltage of the comparator 34 is denoted as Vofc, Vref+Vofc is equivalently inputted to the positive input of the comparator 34 and Vref is inputted to the negative input of the comparator 34. Thus, in the case of Vofc>0, a high-power voltage is output as the maximum value of the output of the comparator 34. In the case of Vofc<0, a low-power voltage is output as the minimum value of the output of the comparator 34. Therefore, in the case of Vofc>0, a comparison signal has a high-power voltage. In the case of Vofc<0, the comparison signal has a low-power voltage. When the comparison signal of a high-power voltage is detected, the offset polarity determination unit 410 connects s11 and s14 and s12 and s13 of the crossbar switch 33. When a low-power voltage is detected, the offset polarity determination unit 410 makes a transition to the offset measurement processing without changing the connection of the crossbar switch 33.

The offset measurement processing is performed by the offset measurement processing unit 411 of the calibration control unit 41. In the offset measurement processing, SW5 is disconnected and SW7 is disconnected after being connected. Thereafter, a charge storing step and a comparing step are repeated until the output of the comparator changes. In the following description, Vofc>0 is satisfied and s11 and s14 are connected to each other and s12 and s13 are connected to each other in the crossbar switch 33 (corresponding to FIG. 6(b)).

In the charge storing step, SW5 is connected during the predetermined time Δt and then is disconnected. When viewed from the current source 56, Co and the parasitic capacitance Cp2 are connected in parallel, so that a charge supplied from the current source 56 in the predetermined time Δt is stored so as to generate the same voltage in Co and Cp2. If voltages Vo,0 and Vo,1 (hereinafter, will be referred to as the voltages of Co) are generated from charges stored in Co and Cp2 before and after the connected state of SW5 during the predetermined time Δt, the following expressions are obtained from a charge Δt Io supplied from the current source during the predetermined time Δt and the conservation of charge.

Formula 57

$$(Co + Cp2)Vo,1 = (Co + Cp2)Vo,0 + \Delta tIo \quad (83)$$
$$Vo,1 = Vo,0 + \frac{\Delta tIo}{Co + Cp2}$$

Subsequently, in the comparing step, the output of the comparator 34 is monitored by a control unit 40. The positive input of the comparator 34 is equivalent to Vref+Vofc. If a negative input expressed by Expression (83) is large, the output of the comparator 34 has a low-power voltage, whereas if the negative input is small, the output of the comparator 34 has a high-power voltage. If the output of the comparator 34 has a high-power voltage, a transition is made to the charge storing step.

In the case of Vofc>0, the charge storing step and the comparing step are repeated until the output of the comparator changes from the high-power voltage to the low-power voltage. The voltage of Co is expressed by an arithmetic series according to Expression (83), so that when the charge storing step and the comparing step are repeated k times, a voltage Vo,k of Co is expressed as follows:

Formula 58

$$Vo,k = k\frac{\Delta tIo}{Co + Cp2} + Vo,0 = kVGi + Vo,0 \quad (84)$$

$$VGi = \frac{\Delta tIo}{Co + Cp2} \quad (85)$$

Figure 7:
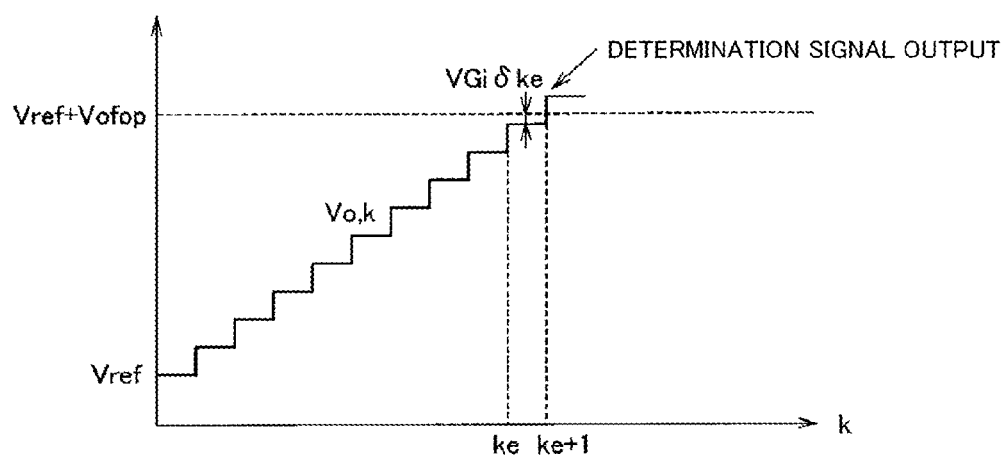
FIG. 7 is a schematic diagram of an operation of the comparator in FIG. 5.

In the offset measurement processing, SW7 is first connected and thus Vo,0 changes to Vref. FIG. 7 indicates the relationship of the negative input voltage Vo,k and k, the number of integrations, with the positive input voltage Vref+Vofc of the comparator 34. As the number of integrations increases, Vo,k increases toward Vref+Vofc. If the output of the comparator 34 changes from the high-power voltage of an original output to a low-power voltage when the number of integrations is ke+1, ke is defined as the number of offset integrations. When the positive and negative inputs of the comparator are equal to each other, the following expression is established:

Formula 59

$$Vref+Vofc=(ke+\delta ke)VGi+Vref \quad (86)$$

In Expression (86), δke indicates a real number of 0 to less than 1 and VGiδke indicates a voltage difference between Vref+Vofc and the voltage of Co when the number of integrations is ke.

The integration unit measurement processing is performed by the integration-unit measuring processing unit 412 of the calibration control unit 41. In the integration unit measurement processing for Vofc>0, SW7 is disconnected. First, the first number of integrations is measured while s11 and s13 are connected to each other and s12 and s14 are connected to each other in the crossbar switch 33, and then the second number of integrations is measured while s11 and s13 are connected to each other and s12 and s14 are connected to each other in the crossbar switch 33. In the measurement of the first number of integrations and the second number of integrations, the charge storing step and the comparing step are repeated.

After SW5 is disconnected, SW6 is connected to reset a charge stored in Co. Thereafter, in the charge storing step, SW5 is connected during the predetermined time Δt and then SW5 is disconnected. If Co and Cp2 have voltages Vo,0 and Vo,1, respectively, before and after the connected state of SW5 during the predetermined time Δt, the following relational expressions are obtained:

Formula 60

$$(Co+Cp2)Vo,1 = (Co+Cp2)Vo,0+\Delta tIo \quad (87)$$
$$Vo,1 = Vo,0+\frac{\Delta tIo}{Co+Cp2}$$

In the comparing step, the output of the comparator 34 is monitored by the control/processing unit. The charge storing step and the comparing step are repeated until the output of the comparator 34 changes from the original high-power voltage to a low-power voltage. When the steps are repeated k times, Co has the same voltage as in Expression (84). If the output of the comparator 34 changes from the high-power voltage of an original output to a low-power voltage when the number of integrations is kf1+1, kf1 is defined as the first number of integrations. Regarding the first number of integrations, the following equation is established:

Formula 61

$$Vref+Vofop=(kf1+\delta kf)VGi \quad (88)$$

In Expression (88), δkf1 indicates a real number of 0 to less than 1 and VGiδkf1 indicates a voltage difference between Vref+Vofc and the voltage of Co when the number of integrations is kf1.

Subsequently, SW5 is disconnected while s11 and s13 are connected to each other and s12 and s14 are connected to each other in the crossbar switch 33, and then SW6 is connected to reset a charge stored in Co. Thereafter, the charge storing step and the comparing step are repeated until a second integration unit voltage is obtained. In this state, the first output of the comparator 34 becomes a low-power voltage.

In the charge storing step, SW5 is connected during the predetermined time Δt and then SW5 is disconnected. The connections between s11 and s13 and between s12 and s14 in the crossbar switch 33 correspond to the equivalent circuit of FIG. 6(a), so that Co and Cp1 are connected in parallel. In the relational expression of the voltages Vo,0 and Vo,1 of Co before and after the connected state of SW1 during the predetermined time at, Cp2 in Expression (83) is replaced with Cp1.

Formula 62

$$Vo,1 = Vo,0+\frac{\Delta tIo}{Co+Cp1} \quad (89)$$

In the comparing step, the output of the comparator 34 is monitored by the control unit 40. The charge storing step and the comparing step are repeated until the output of the comparator 34 changes from the original low-power voltage to a high-power voltage. When the steps are repeated k times, Vo,0 is 0 and thus the output of the comparator is expressed as follows:

Formula 63

$$Vo,k = k\frac{\Delta tIo}{Co+Cp1} = kVGj \quad (90)$$

$$VGj = \frac{\Delta tIo}{Co+Cp1} \quad (91)$$

In the comparing step, if the output of the comparator 34 changes from the low-power voltage of the original output to a high-power voltage when the number of integrations is kf2+1, kf2 is defined as the second number of integrations. Regarding the second number of integrations, the following equation is established:

Formula 64

$$Vref=(kf2+\delta kf2)Vqi+Vofop \quad (92)$$

In Expression (92), δkf2 indicates a real number of 0 to less than 1 and VGiδkf2 indicates a difference between Vref and the sum of the voltage of Co and Vofc when the number of integrations is kf2.

Thereafter, VGj and Vofc are determined. In order to simplify the expansion of the expression, Ke=ke+δke, Kf1=kf1+δkf1, and Kf2=kf2+δkf2 are determined. According to Expression (86), the following expression is obtained:

Formula 65

$$VGi = \frac{Vofc}{Ke} \quad (93)$$

By substituting Expression (93) into Expression (88), the following expressions are obtained:

Formula 66

$$Vref+Vofc = Kf1\frac{Vofc}{Ke} \quad (94)$$

$$Vofc = \frac{Ke}{Kf1-Ke}Vref$$

According to Expression (92), the following expressions are obtained:

Formula 67

$$Vref = Kf2VGj + Vofc \qquad (95)$$
$$VGj = \frac{Vref - Vofc}{Kf2}$$

VGj and Vofc include unknown real numbers δke, δkf1, and δkf2 of 0 to less than 1. A method of determining VGj and Vofc, from which the unknown real numbers are removed, will be described below.

Expression (94) is partially differentiated with respect to δke and δkf1, obtaining the following expressions:

Formula 68

$$\frac{\partial Vofc}{\partial(\delta ke)} = \qquad (96)$$
$$\frac{1}{Kf1-Ke}Vref + \frac{Ke}{(Kf1-Ke)^2}Vref = \frac{Kf1}{(Kf1-Ke)^2}Vref > 0$$

$$\frac{\partial Vofc}{\partial(\delta kf1)} = -\frac{Ke}{(Kf1-Ke)^2}Vref < 0 \qquad (97)$$

According to Expression (96) and Expression (97), Vofc monotonously decreases with respect to δkf1 and monotonously increases with respect to δke. Thus, the range of Vofc is expressed as follows:

Formula 69

$$\frac{ke}{kf1-ke+1}Vref < Vofc < \frac{ke+1}{kf1-ke-1}Vref \qquad (98)$$

If Vofc is set at Vofcc that is expressed by Expression (99) as the median value of the range of Expression (98), the calibrated value of Vofc can be derived with accuracy lower than ΔVofc expressed by Expression (100).

Formula 70

$$Vofcc = \frac{ke+1}{2(kf1-ke-1)}Vref + \frac{ke}{2(kf1-ke+1)}Vref \qquad (99)$$

$$\Delta Vofc = \frac{ke+1}{2(kf1-ke-1)}Vref - \frac{ke}{2(kf1-ke+1)}Vref \qquad (100)$$

Expression (95) is partially differentiated with respect to δke, δkf1, and δkf2, obtaining the following expressions:

Formula 71

$$\frac{\partial VGj}{\partial(\delta ke)} = \frac{\partial Vofop}{\partial(\delta ke)} < 0 \qquad (101)$$

$$\frac{\partial VGj}{\partial(\delta kf1)} = -\frac{\partial Vofop}{\partial(\delta kf1)} > 0 \qquad (102)$$

-continued $$\frac{\partial VGj}{\partial(\delta kf2)} = -\frac{Vref - Vofop}{Kf2^2} < 0 \qquad (103)$$

According to Expression (101), Expression (102), and Expression (103), VGj monotonously decreases with respect to δke and δkf2 and monotonously increases with respect to δkf1. By substituting Expression (94) into Expression (95), the range of VGj is expressed by Expression (104).

Formula 72

$$VGj = \frac{Vref - Vofc}{Kf2} = \frac{Vref}{Kf2}\left(1 - \frac{Ke}{Kf1-Ke}\right) = \qquad (104)$$
$$\frac{Kf1-2Ke}{Kf2(Kf1-Ke)}Vref < \frac{kf1-2ke-2}{(kf2+1)(kf1-ke-1)}Vref <$$
$$VGj < \frac{kf1-2ke+1}{(kf2)(kf1-ke+1)}Vref$$

If VGj is set at VGjc that is expressed by Expression (105) as the median value of the range of Expression (104), the calibrated value of VGj can be derived with accuracy lower than ΔVGj expressed by Expression (106).

Formula 73

$$VGjc = \frac{kf1-2ke+1}{2kf2(kf1-ke+1)}Vref - \frac{kf1-2ke-2}{2(kf2+1)(kf1-ke-1)}Vref \qquad (105)$$

$$\Delta VGj = \frac{kf1-2ke+1}{2kf2(kf1-ke+1)}Vref - \frac{kf1-2ke-2}{2(kf2+1)(kf1-ke-1)}Vref \qquad (106)$$

As described above, even if the offset or gain of the comparator or a capacity constituting an integration unit voltage is changed by aging, the processing in a calibrated state can derive the calibrated values of the offset Vofc of the comparator 34 and the integration unit voltage VGj with predetermined accuracy.

In the above description, Vofc>0 is determined. VGj and Vofc can be calibrated also in the case of Vofc<0.

If Vofc<0 is determined in the offset polarity determination processing, the processing makes the transition to the offset measurement processing while s11 and s13 are connected to each other and s12 and s14 are connected to each other in the crossbar switch 33.

In the offset measurement processing, the connections of the switches other than crossbar switch 33 are identical to those in the case of Vofc>0 and thus the explanation thereof is omitted.

A state in which s11 and s13 are connected to each other and s12 and s14 are connected to each other in the crossbar switch 33 corresponds to FIG. 6(*a*), so that the parasitic capacitance is Cp1. Thus, when the charge storing step and the comparing step are repeated k times, the voltage Vo,k is expressed by substituting Cp1 for Cp2 in Expression (84) as follows:

Formula 74

$$Vo, k = k\frac{\Delta tIo}{Co+Cp1} + Vo, 0 = kVGj + Vo, 0 \qquad (107)$$

In the offset measurement processing, SW7 is first connected then is disconnected, so that Vo,0=Vref is determined. When s11 and s13 are connected to each other and s12 and s14 are connected to each other in the crossbar switch 33, Vo,k is inputted to the positive input of the comparator and Vo,k+Vofop and Vref of the negative input are equivalently compared with each other. As the number of integrations increases, Vo,k increases toward Vref. If the output of the comparator 34 changes from a low-power voltage of the original output to a high-power voltage when the number of integrations is ke+1, ke is defined as the number of offset integrations. When the positive and negative inputs of the comparator are equal to each other, the following expression is established:

Formula 75

$$Vref=(ke+\delta ke)VQj+Vref+Vofc \quad (108)$$

In Expression (108), $\delta ke$ indicates a real number of 0 to less than 1 and $VGj\delta ke$ indicates a voltage difference between Vref and the voltage of Co when the number of integrations is ke.

In the integration unit measurement processing when Vofc<0 is determined, the charge storing step and the comparing step are repeated while s11 and s13 are connected to each other and s12 and s14 are connected to each other in the crossbar switch 33, so that the first number of integrations is measured. The connection of SW7 is identical to that in the case of Vofc>0. Since the voltages of Co and Cp1 are inputted to the positive input of the comparator 34 and Vref is inputted to the negative input of the comparator 34, the output of the comparator 34 is a low-power voltage when the charge of Co is reset.

The operations of SW5 and SW6 are identical to those in the case of Vofc>0 and thus the detailed explanation thereof is omitted. The relational expression of the voltages Vo,0 and Vo,1 of Co before and after the connected state of SW1 during the predetermined time $\Delta t$ is identical to Expression (89).

If the output of the comparator 34 changes from the low-power voltage of the original output to a high-power voltage when the number of integrations is kf1+1, kf1 is defined as the first number of integrations. Regarding the first number of integrations, the following equation is established:

Formula 76

$$Vref=(kf1+\delta kf1)VQj+Vofc \quad (109)$$

In Expression (109), $\delta kf1$ indicates a real number of 0 to less than 1 and $VGj\delta kf1$ indicates a voltage difference between Vref and the voltage of Co when the number of integrations is kf1.

In order to simplify the expansion of the expression, Ke=ke+$\delta$ke, Kf1=kf1+$\delta$kf1, Kj1=kj1+$\delta$kj1, and Kj2=kj2+$\delta$kj2 are determined. A difference between Expression (109) and Expression (108) is determined so as to obtain expressions as follows:

Formula 77

$$0 = (Kf1 - Ke)VGj - Vref \quad (110)$$
$$VGj = \frac{Vref}{Kf1 - Ke}$$

By substituting Expression (110) into Expression (108), the following expressions are obtained:

Formula 78

$$0 = KeVGj + Vofc \quad (111)$$
$$Vofc = \frac{-Ke}{Kf1 - Ke}Vref$$

Expression (111) is partially differentiated with respect to $\delta$ke and $\delta$kf1, obtaining the following expressions:

Formula 79

$$\frac{\partial Vofc}{\partial (\delta ke)} = \quad (112)$$
$$\frac{-1}{Kf1 - Ke}Vref - \frac{Ke}{(Kf1 - Ke)^2}Vref = \frac{-Kf1}{(Kf1 - Ke)^2}Vref < 0$$

$$\frac{\partial Vofc}{\partial (\delta kf1)} = \frac{Ke}{(Kf1 - Ke)^2}Vref > 0 \quad (113)$$

According to Expression (112) and Expression (113), Vofc monotonously decreases with respect to $\delta$ke and monotonously increases with respect to $\delta$kf1. Thus, the range of Vofc is expressed as follows:

Formula 80

$$\frac{-ke - 1}{kf1 - ke - 1}Vref < Vofc < \frac{-ke}{kf1 - ke + 1}Vref \quad (114)$$

If Vofc is set at Vofcc that is expressed by Expression (115) as the median value of the range of Expression (114), the calibrated value of Vofc can be derived with accuracy lower than $\Delta$Vofc expressed by Expression (116).

Formula 81

$$Vofcc = \frac{-ke}{2(kf1 - ke + 1)}Vref + \frac{-ke - 1}{2(kf1 - ke + 1)}Vref \quad (115)$$

$$\Delta Vofc = \frac{-ke}{2(kf1 - ke + 1)}Vref - \frac{-ke - 1}{2(kf1 - ke - 1)}Vref \quad (116)$$

Expression (110) is partially differentiated with respect to $\delta$ke and $\delta$kf1, obtaining the following expressions:

Formula 82

$$\frac{\partial VGj}{\partial (\delta ke)} = \frac{Vref}{(Kf1 - Ke)^2} > 0 \quad (117)$$

$$\frac{\partial VGj}{\partial (\delta kf1)} = -\frac{Vref}{(Kf1 - Ke)^2} < 0 \quad (118)$$

According to Expression (117) and Expression (118), VGj monotonously decreases with respect to $\delta$kf1 and monotonously increases with respect to $\delta$ke. Thus, the range of VGj is expressed by Expression (119).

Formula 83

$$\frac{Vref}{kf1-ke+1} < VGj < \frac{Vref}{kf1-ke-1} \quad (119)$$

If VGj is set at VGjc that is expressed by Expression (120) as the median value of the range of Expression (180), the calibrated value of VGj can be derived with accuracy lower than ΔVGj expressed by Expression (121).

Formula 84

$$VGjc = \frac{Vref}{2(kf1-ke-1)} + \frac{Vref}{2(kf1-ke+1)} \quad (120)$$

$$\Delta VGj = \frac{Vref}{2(kf1-ke-1)} - \frac{Vref}{2(kf1-ke+1)} \quad (121)$$

As described above, also in the case of Vofc<0, even if the offset or gain of the comparator 34 or a capacity constituting an integration unit voltage is changed by aging, the processing in a calibrated state can derive the calibrated values of the offset Vofc of the comparator 34 and the integration unit voltage VGj with predetermined accuracy.

In a converted state, a10 and c10 of the switching unit 32 are connected to each other. An input signal is held in a sample-hold unit 31 and SW6 is connected to reset the charge of Co. Thereafter, by the same processing as the integration unit measurement in the case of Vofc<0, the number of integrations is determined such that the voltage of Co has the same magnitude as the held input signal while s11 and s13 are connected to each other and s12 and s14 are connected to each other in the crossbar switch 33.

In this state, when the charge storing step and the comparing step are repeated k times, the voltage Vo,k of Co is expressed by Expression (90). If the sample-hold unit 31 holds a voltage Vin, Vin is inputted to the negative input of the comparator 34 and Vop,k is inputted to the positive input of the comparator 34 when s11 and s13 are connected to each other and s12 and s14 are connected to each other in the crossbar switch 33. In this case, if the number of integrations is km1 when the comparison signal is first output from the comparator 34, the following expression is established:

Formula 85

$$Vin = VQj(km1 + \delta km1) + Vofc \quad (122)$$

δkm1 indicates a real number of 0 to less than 1 and VGjδkm1 indicates a difference between Vin and the sum of the output of the integrating circuit and the offset of the comparator when the number of integrations is km1. Vin monotonously increases with respect to δkm1. Since δkm1 is a real number of 0 to less than 1, Vin is placed within the following range:

Formula 86

$$Vqjkm1 + Vofc \le Vin < ViGj(km1+1) + Vofc \quad (123)$$

If Expression (124) indicating the median value of Expression (123) is determined as Vin, Vin is determined with the accuracy of Expression (125). At this point, if the comparator 34 has a positive offset voltage, calibrated values derived from Expression (105) and Expression (99) are used for VGj and Vofc. If the comparator 34 has a negative offset voltage, calibrated values derived from Expression (120) and Expression (115) are used for VGj and Vofc.

Formula 8]

$$Vin = \frac{1}{2}\{VGj(km1+1) + Vofc + VGjkm1 + Vofc\} \quad (124)$$

$$= \frac{VGr2}{2}(2km1+1) + Vofc$$

$$\Delta Vin = \frac{1}{2}\{VGj(km1+1) + Vofc - VGjkm1 + Vofc\} \quad (125)$$

$$= \frac{VGj}{2}$$

As described above, even if the offset of the comparator 34 or a capacity constituting an integration unit is changed by aging, the AD converter 200 with a self-calibration function according to the present embodiment can calibrate the offset of the comparator 34 and the integrating unit 55 acting as an analog-value output unit for a DA converter, so that the AD converter can be provided with long-term stability.

In the above description, if the comparator 34 has a positive offset voltage, Vofc and VGj are set at the median values of the ranges expressed by Expressions (98) and (104). Ke, Kf1, and Kf2 in Expression (94) and Expression (95) may be replaced with ke, kf1, and kf2. If the comparator 34 has a negative offset voltage, Vofc and VGj may not be set at the median values of the ranges expressed by Expressions (114) and (119) and Ke and Kf1 in Expression (110) and Expression (111) may be replaced with ke and kf1.

As described above, the AD converter 200 with a self-calibration function according to the present embodiment is an AD converter with a self-calibration function that eliminates the need for a measuring device for calibration. The AD converter 200 with a self-calibration function is provided with the control unit 40 including the calibration control unit 41 that controls an operation for calibrating the control unit 40 and a conversion control unit 42 that controls an operation for converting a target input voltage into a digital signal, a reference voltage unit 10 that outputs the reference voltage Vref, the integrating unit 55 that converts a predetermined unit voltage into an integrated voltage, the comparator 34 that has two inputs and compares an integrated voltage and an input voltage or the reference voltage Vref, and an integrating converter unit 30. In this configuration, the integrating converter unit 30 includes the crossbar switch 33 that switches connections between the case where an integrated voltage is inputted to one of the inputs of the comparator and an input voltage or the reference voltage is inputted to the other input and the case where an input voltage or the reference voltage is inputted to one of the inputs of the comparator and the other input integrated voltage is inputted.

This can provide the AD converter with a self-calibration function that eliminates the need for a measuring device for calibration outside the AD converter.

The calibration control unit 41 includes the offset polarity determination unit 410 for determining the polarity of the offset voltage of the comparator 34, the offset measurement processing unit 411, and the integration-unit measurement processing unit 412. In this configuration, the offset measurement processing unit 411 causes the integrating unit 55 to generate an integrated voltage by integrating the unit voltage by using the reference voltage Vref as an initial value. The integrated voltage that is generated by integrating the unit voltage by using the generated reference voltage Vref as an initial value is compared with the reference voltage Vref by the comparator 34, obtaining ke, the number of offset integrations. As a result of the determination by the offset polarity determination unit 410, if the offset voltage of the comparator 34 has a positive polarity, the integration-unit measurement processing unit 412 causes the integrating unit 55 to generate an integrated voltage by integrating the predetermined unit voltage and compare the reference voltage Vref with the integrated voltage generated by integrating the predetermined unit voltage while the connections of the crossbar switch 33 are switched, obtaining kf1, the first number of integrations and kf2, the second number of integrations. Alternatively, as a result of the determination by the offset polarity determination unit 410, if the offset voltage of the comparator 34 has a negative polarity, the integration-unit measurement processing unit 412 causes the integrating unit 55 to generate an integrated voltage by integrating the predetermined unit voltage and compare the reference voltage Vref with the integrated voltage generated by integrating the predetermined unit voltage, obtaining kf1, the first number of integrations. If the offset voltage of the comparator 34 has a positive polarity, the conversion control unit converts an input voltage to a digital signal by using the calibrated value of the offset voltage of the comparator 34 based on ke, kf1, and kf2 and the calibrated value of the unit voltage in the integration-unit measurement processing unit 412. If the offset voltage of the comparator 34 has a negative polarity, the conversion control unit 42 converts an input voltage to a digital signal by using the calibrated value of the offset voltage of the comparator 34 based on ke and kf1 and the calibrated value of the unit voltage.

An integrating converter unit 50 includes the current source 56, the unit capacitor Co charged by repeatedly connecting the current source 56, the sixth switch SW6 for connecting both terminals of the unit capacitor Co, the fifth switch SW5 for repeatedly connecting the current source 56 and the unit capacitor Co, and the seventh switch SW7 for connecting the reference voltage unit 10, at one of the terminals of the unit capacitor Co connected to the fifth switch SW5. The offset polarity determination unit 410 connects the seventh switch SW7 and disconnects the fifth switch SW5 and the sixth switch SW6 from each other. The offset measurement processing unit 411 disconnects the fifth switch SW5, connects the seventh switch SW7, and then disconnects the seventh switch SW7.

If the comparator 34 has a positive offset voltage, the calibration control unit 41 determines the median value of a unit voltage range as a calibrated value of the unit voltage, the range being obtained by the relationship with the unit voltage that monotonously decreases with respect to ke, the number of offset integrations and kf2, the second number of integrations, and monotonously increases with respect to kf1, the first number of integrations, and the setting of a predetermined width for ke, the number of offset integrations and kf1 and kf2, the first number of integrations and the second number of integrations that are obtained by the integration-unit measurement processing unit 412. Furthermore, the calibration control unit 41 determines the median value of an offset voltage range of the comparator 34 as a calibrated value of the offset voltage of the comparator 34, the range being obtained by the relationship with the offset voltage of the comparator 34 and the setting of a predetermined width for ke, the number of offset integrations and kf1, the first number of integrations obtained by the integration-unit measurement processing unit 412, the offset voltage monotonously increasing with respect to ke, the number of offset integrations and monotonously decreasing with respect to kf1, the first number of integrations. If the comparator 34 has a negative offset voltage, the calibration control unit 41 determines the median value of a unit voltage range as a calibrated value of the unit voltage, the range being obtained by the relationship with the unit voltage that monotonously increases with respect to ke, the number of offset integrations measured by the offset measurement processing unit 411, and monotonously decreases with respect to kf1, the first number of integrations, and the setting of a predetermined width for ke, the number of offset integrations and kf1, the first number of integrations obtained by the integration-unit measurement processing unit 412. Furthermore, the calibration control unit 41 determines the median value of an offset voltage range of the comparator 34 as a calibrated value of the offset voltage of the comparator 34, the range being obtained by the relationship with the offset voltage of the comparator 34 and the setting of a predetermined width for ke, the number of offset integrations and kf1, the first number of integrations obtained by the integration-unit measurement processing unit 412, the offset voltage monotonously decreasing with respect to ke, the number of offset integrations, and monotonously increasing with respect to kf1, the first number of integrations.

Even if the offset of the comparator 34, the offset or gain of the operational amplifier 350, a capacity constituting an integration unit voltage, or the like is changed by aging, the AD converter 100 with a self-calibration function according to the present embodiment can calibrate the offset of the comparator 34 and the integrating unit 35 acting as an analog-value output unit for a DA converter, so that the AD converter can be provided with long-term stability.

Furthermore, even if the offset of the comparator 34 or a capacity constituting an integration unit voltage is changed by aging, the AD converter 200 with a self-calibration function according to the present embodiment can calibrate the offset of the comparator 34 and the integrating unit 55 acting as an analog-value output unit for a DA converter, so that the AD converter can be provided with long-term stability.

The AD converters 100 and 200 with self-calibration functions according to the present embodiment achieves self-calibration by remote control without the need for a measuring device for calibration. Hence, the AD converter with a self-calibration function according to the present invention is suitably used in combination with multiple sensors at remote locations.

Specifically, an operator can calibrate multiple sensors by remote control without going to the sites of the sensors.

The present invention is not limited to the foregoing embodiments and can be modified within the scope of the claims.

REFERENCE SIGNS LIST

10 Reference voltage unit
20, 40 Control unit
21, 41 Calibration control unit
22, 42 Conversion control unit
21 Calibration control unit
22 Conversion control unit
30 Integrating converter unit
31 Sample-hold unit
32 Switching unit
33 Crossbar switch 34 Comparator
35 Integrating unit
100, 200 AD converter with a self-calibration function
210 Offset-cancellation measurement processing unit
211 Integration-unit measurement processing unit
410 Offset polarity determination unit
411 Offset measurement processing unit
412 Integration-unit measurement processing unit

The invention claimed is:

1. An AD converter with a self-calibration function that eliminates need for a measuring device for calibration, the AD converter comprising:
   a control unit including a calibration control unit that controls an operation for calibrating the control unit and a conversion control unit that controls an operation for converting a target input voltage into a digital signal;
   a reference voltage unit that outputs a reference voltage; and
   an integrating converter unit including an integrating unit that generates an integrated voltage obtained by integrating a predetermined unit voltage, a comparator that has two inputs and compares the integrated voltage and the input voltage or the reference voltage, and a crossbar switch that switches a connection between a case where the integrated voltage is inputted to one of inputs of the comparator and the input voltage or the reference voltage is inputted to the other input and a case where the input voltage or the reference voltage is inputted to one of the inputs of the comparator and the integrated voltage is inputted to the other input.

2. The AD converter with a self-calibration function according to claim 1, wherein the integrating unit includes an operational amplifier, the calibration control unit includes:
   an offset-cancellation measuring unit that causes the integrating unit to generate an integrated voltage by integrating a unit voltage from which an offset voltage of the operational amplifier is removed, and compare, by switching connections of the crossbar switch, the integrated voltage and the reference voltage so as to obtain a first number of offset cancellation integrations and a second number of offset cancellation integrations; and
   an integration-unit measuring unit that causes the integrating unit to generate an offset integrated voltage by integrating the unit voltage including the offset voltage of the operational amplifier, and causes the comparator to compare the offset integrated voltage and the reference voltage so as to obtain a first number of integrations, and the converter unit converts the input voltage into a digital signal by using a calibrated value of the offset voltage of the operational amplifier based on the first number of offset cancellation integrations, the second number of offset cancellation integrations, and the first number of integrations, and the calibrated value of the unit voltage from which the offset voltage of the operational amplifier is removed.

3. The AD converter with a self-calibration function according to claim 2, wherein the integrating unit includes:
   a first capacitor for holding the unit voltage;
   a second capacitor for holding the integrated voltage;
   a first switch for connecting one of terminals of the first capacitor to a positive input terminal of the operational amplifier connected to the reference voltage or a ground voltage;
   a second switch for connecting the other terminal of the first capacitor to the ground voltage or a negative input terminal of the operational amplifier;
   a third switch for connecting both terminals of the second capacitor; and
   a fourth switch for connecting the other terminal of the second capacitor or the negative input terminal of the operational amplifier to an output terminal of the operational amplifier, and the offset-cancellation measurement processing unit connects the negative input terminal of the operational amplifier and the output terminal of the operational amplifier via the fourth switch and then connects the other terminal of the first capacitor and the negative input terminal of the operation amplifier via the second switch.

4. The AD converter with a self-calibration function according to claim 1, wherein the calibration control unit includes:
   an offset polarity determination unit for determining a polarity of an offset voltage of the comparator;
   an offset measuring unit that causes the integrating unit to generate an integrated voltage by integrating the unit voltage by using the reference voltage as an initial value, and causes the comparator to compare the integrated voltage with the reference voltage so as to obtain the number of offset integrations, the integrated voltage being generated by integrating the unit voltage by using the generated reference voltage as an initial value; and
   an integration-unit measuring unit that causes, if the offset voltage of the comparator has a positive polarity as a result of the determination by the offset polarity determination unit, the integrating unit to generate an integrated voltage by integrating a predetermined unit voltage and compare the integrated voltage generated by integrating the predetermined unit voltage with the reference voltage so as to obtain a first number of integrations and a second number of integrations, and causes, if the offset voltage of the comparator has a negative polarity as a result of the determination by the offset polarity determination unit, the integrating unit to generate an integrated voltage by integrating a predetermined unit voltage and compare the integrated voltage generated by integrating the predetermined unit voltage with the reference voltage so as to obtain a first number of integrations, the converter unit converts, if the offset voltage of the comparator has a positive polarity, the input voltage into a digital signal by using a calibrated value of the offset voltage of the comparator based on the number of offset integrations, the first number of integrations, and the second number of integrations and a calibrated value of the unit voltage, and the converter unit converts, if the offset voltage of the comparator has a negative polarity, the input voltage into a digital signal by using a calibrated value of the offset voltage of the comparator based on the number of offset integrations and the first number of integrations and a calibrated value of the unit voltage.

5. The AD converter with a self-calibration function according to claim 4, wherein the integrating unit includes:
   a current source;
   a unit capacitor charged by repeatedly connecting the current source; a sixth switch for connecting both terminals of the unit capacitor;
   a fifth switch for repeatedly connecting the current source and the unit capacitor; and
   a seventh switch for connecting the reference voltage to one of terminals of the unit capacitor connected to the fifth switch, the offset polarity determination processing unit connects the seventh switch and disconnects the fifth switch and the sixth switch from each other, and the offset measuring processing unit disconnects the fifth switch, connects the seventh switch, and then disconnects the seventh switch.

6. The AD converter with a self-calibration function according to claim 2, wherein a median value of a unit voltage range is determined as a calibrated value of the unit voltage, the range being obtained by a relationship with the unit voltage that monotonously decreases with respect to the first number of offset cancellation integrations and the second number of offset cancellation integrations and monotonously increases with respect to the first number of integrations, and a setting of a predetermined width for the first number of offset cancellation integrations and the second number of offset cancellation integrations that are obtained by the offset-cancellation measuring processing unit and the first number of integrations obtained by the integration-unit measurement processing unit, and a median value of an offset voltage range of the operational amplifier is determined as a calibrated value of the offset voltage of the operational amplifier, the range being obtained by a relationship with the offset voltage of the operational amplifier and a setting of a predetermined width for the first number of offset cancellation integrations obtained by the offset-cancellation measuring processing unit and the first number of integrations obtained by the integration-unit measuring processing unit, the offset voltage monotonously increasing with respect to the first number of offset cancellation integrations and monotonously decreasing with respect to the first number of integrations.

7. The AD converter with a self-calibration function according to claim 4, wherein if the comparator has a positive offset voltage, a median value of a unit voltage range is determined as a calibrated value of the unit voltage, the range being obtained by a relationship with the unit voltage that monotonously decreases with respect to the number of offset integrations measured by the offset-cancellation measurement processing unit and the second number of integrations and monotonously increases with respect to the first number of integrations, and a setting of a predetermined width for the number of offset integrations and the first number of integrations and the second number of integrations that are obtained by the integration-unit measurement processing unit, and a median value of an offset voltage range of the comparator is determined as a calibrated value of the offset voltage of the comparator, the range being obtained by a relationship with the offset voltage of the comparator and a setting of a predetermined width for the number of offset integrations and the first number of integrations obtained by the integration-unit measurement processing unit, the offset voltage monotonously increasing with respect to the number of offset integrations and monotonously decreasing with respect to the first number of integrations, and if the comparator has a negative offset voltage, a median value of a unit voltage range is determined as a calibrated value of the unit voltage, the range being obtained by a relationship with the unit voltage that monotonously increases with respect to the number of offset integrations measured by the offset measurement processing unit and monotonously decreases with respect to the first number of integrations, and a setting of a predetermined width for the number of offset integrations and the first number of integrations obtained by the integration-unit measurement processing unit, and a median value of an offset voltage range of the comparator is determined as a calibrated value of the offset voltage of the comparator, the range being obtained by a relationship with the offset voltage of the comparator and a setting of a predetermined width for the number of offset integrations and the first number of integrations obtained by the integration-unit measurement processing unit the offset voltage monotonously decreasing with respect to the number of offset integrations and monotonously increasing with respect to the first number of integrations.

8. The AD converter with a self-calibration function according to claim 3, wherein a median value of a unit voltage range is determined as a calibrated value of the unit voltage, the range being obtained by a relationship with the unit voltage that monotonously decreases with respect to the first number of offset cancellation integrations and the second number of offset cancellation integrations and monotonously increases with respect to the first number of integrations, and a setting of a predetermined width for the first number of offset cancellation integrations and the second number of offset cancellation integrations that are obtained by the offset-cancellation measuring processing unit and the first number of integrations obtained by the integration-unit measurement processing unit, and a median value of an offset voltage range of the operational amplifier is determined as a calibrated value of the offset voltage of the operational amplifier, the range being obtained by a relationship with the offset voltage of the operational amplifier and a setting of a predetermined width for the first number of offset cancellation integrations obtained by the offset-cancellation measuring processing unit and the first number of integrations obtained by the integration-unit measuring processing unit, the offset voltage monotonously increasing with respect to the first number of offset cancellation integrations and monotonously decreasing with respect to the first number of integrations.

9. The AD converter with a self-calibration function according to claim 5, wherein if the comparator has a positive offset voltage, a median value of a unit voltage range is determined as a calibrated value of the unit voltage, the range being obtained by a relationship with the unit voltage that monotonously decreases with respect to the number of offset integrations measured by the offset-cancellation measurement processing unit and the second number of integrations and monotonously increases with respect to the first number of integrations, and a setting of a predetermined width for the number of offset integrations and the first number of integrations and the second number of integrations that are obtained by the integration-unit measurement processing unit, and a median value of an offset voltage range of the comparator is determined as a calibrated value of the offset voltage of the comparator, the range being obtained by a relationship with the offset voltage of the comparator and a setting of a predetermined width for the number of offset integrations and the first number of integrations obtained by the integration-unit measurement processing unit, the offset voltage monotonously increasing with respect to the number of offset integrations and monotonously decreasing with respect to the first number of integrations, and if the comparator has a negative offset voltage, a median value of a unit voltage range is determined as a calibrated value of the unit voltage, the range being obtained by a relationship with the unit voltage that monotonously increases with respect to the number of offset integrations measured by the offset measurement processing unit and monotonously decreases with respect to the first number of integrations, and a setting of a predetermined width for the number of offset integrations and the first number of integrations obtained by the integration-unit measurement processing unit, and a median value of an offset voltage range of the comparator is determined as a calibrated value of the offset voltage of the comparator, the range being obtained by a relationship with the offset voltage of the comparator and a setting of a predetermined width for the number of offset integrations and the first number of integrations obtained by the integration-unit measurement processing unit, the offset voltage monotonously decreasing with respect to the number of offset integrations and monotonously increasing with respect to the first number of integrations.

* * * * *